(12) United States Patent
Le-Thai et al.

(10) Patent No.: US 9,900,538 B2
(45) Date of Patent: Feb. 20, 2018

(54) PHASE DELAY COUNTING ANALOG-TO-DIGITAL CONVERTER CIRCUITRY

(71) Applicant: SEMICONDUCTOR COMPONENTS INDUSTRIES, LLC, Phoenix, AZ (US)

(72) Inventors: Ha Le-Thai, Leuven (BE); Tomas Geurts, Haasrode (BE); Georges Gielen, Kessel-lo (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/157,677

(22) Filed: May 18, 2016

(65) Prior Publication Data
US 2017/0339358 A1    Nov. 23, 2017

(51) Int. Cl.
*H04N 5/378* (2011.01)
*H03M 1/12* (2006.01)

(52) U.S. Cl.
CPC .......... *H04N 5/378* (2013.01); *H03M 1/1205* (2013.01); *H03M 1/1245* (2013.01)

(58) Field of Classification Search
None
See application file for complete search history.

(56) References Cited

U.S. PATENT DOCUMENTS

| 5,117,227 | A | 5/1992 | Goeke |
| 7,880,662 | B2 | 2/2011 | Bogaerts |
| 9,204,070 | B2 * | 12/2015 | Takahashi ............ H04N 5/3745 |
| 2009/0040352 | A1 * | 2/2009 | Kawaguchi ............. G06F 3/044 |
| | | | 348/308 |
| 2009/0256735 | A1 | 10/2009 | Bogaerts |
| 2014/0240157 | A1 | 8/2014 | Noh et al. |
| 2015/0014517 | A1 * | 1/2015 | Ikebe ..................... H03M 1/14 |
| | | | 250/208.1 |

(Continued)

OTHER PUBLICATIONS

Straayer et al., "A Multi-Path Gated Ring Oscillator TDC With First-Order Noise Shaping" IEEE Journal of Solid-State Circuits, vol. 44, No. 4, Apr. 2009, pp. 1089-1098.

(Continued)

*Primary Examiner* — James Hannett
(74) *Attorney, Agent, or Firm* — Treyz Law Group, P.C.; Tianyi He

(57) ABSTRACT

An analog-to-digital converter may include an integrator, a gated ring oscillator, a coarse counter, a phase state register, a counter register, and logic circuitry. The gated ring oscillator may output a phase state signal continuously to the phase state register. The phase state signal includes multiple phase nodes, each of which is created by transmitting a signal through a number of delay stages. One of the phase nodes may be provided to the coarse counter. The phase state register and counter register may store the most current corresponding phase state and coarse counter outputs, respectively. A control signal corresponding to an analog image input signal may control the output of stored phase states and stored coarse counter outputs to the logic circuitry. The logic circuitry may generate a digital version of the analog image input signal based on the outputs of the phase state and counter registers.

19 Claims, 16 Drawing Sheets

(56) References Cited

U.S. PATENT DOCUMENTS

2016/0233871 A1* 8/2016 Zerbe .................. H03L 7/06

OTHER PUBLICATIONS

Lim et al., "A 1.1e-Temporal Noise 1/3.2-inch 8Mpixel CMOS Image Sensor using Pseudo-Multiple Sampling" IEEE International Solid-State Circuits Conference, Session 22, Image Sensors, 22.2, Feb. 10, 2010, pp. 396-398.
Totsuka et al., "An APS-H-Size 250Mpixel CMOS Image Sensor Using Column Single-Slope ADCs with Dual-Gain Amplifiers" IEEE International Solid-State Circuits Conference, Session 6, Image Sensors, 6.4, Feb. 1, 2016, pp. 116-118.
Arai et al., :A 1.1μm 33Mpixel 240fps 3D-Stacked CMOS Image Sensor with 3-Stage Cyclic-Based Analogto-Digital Converters IEEE International Solid-State Circuits Conference, Session 6, Image Sensors, 6.9, Feb. 1, 2016, pp. 126-128.

* cited by examiner

PHASE DELAY COUNTING ANALOG-TO-DIGITAL CONVERTER CIRCUITRY

BACKGROUND

This relates generally to imaging devices, and more particularly, to imaging devices having analog-to-digital converters (ADCs).

Image sensors are commonly used in electronic devices such as cellular telephones, cameras, and computers to capture images. In a typical arrangement, an electronic device is provided with an array of image pixels arranged in pixel rows and pixel columns. Circuitry is commonly coupled to each pixel column for reading out analog image signals from the image pixels. Analog-to-digital converters are used to convert the analog image signals to corresponding digital image data.

The ADCs are often dual-slope ADCs having an integrator and a comparator that provide an output to a counter. The counter is controlled using rising and/or falling edges of a clock signal. During a first integration period, from a common-mode level, the integrator integrates an analog image signal for a period of time. This period of time will determine the bit resolution of the conversion. A second integration period starts from a voltage level at the end of the first integration period. During the second integration period, a reference signal, instead of the analog image signal as in the first integration period, is applied to the integrator input. The second integration period ends when the integrator output crosses the common-mode level of the comparator. The durations of both the first and second integration periods are measured. Digital data corresponding to the analog image signal is obtained using a ratio of the durations of the first and second integration periods. A counter outputs the digital data as the ADC's digital outputs.

In conventional dual-slope ADCs, there is a trade-off between conversion time and resolution in their implementation. Consequently, it can be difficult to perform both high-speed conversion at a low bit resolution and high-speed conversion at high bit resolution with satisfactory noise performance. In addition, clocking the ADCs using rising and/or falling edges of a clock signal imposes an inherent limit to the speed with which the data is converted.

It would therefore be desirable to be able to provide imaging devices with improved analog-to-digital converter circuitry.

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
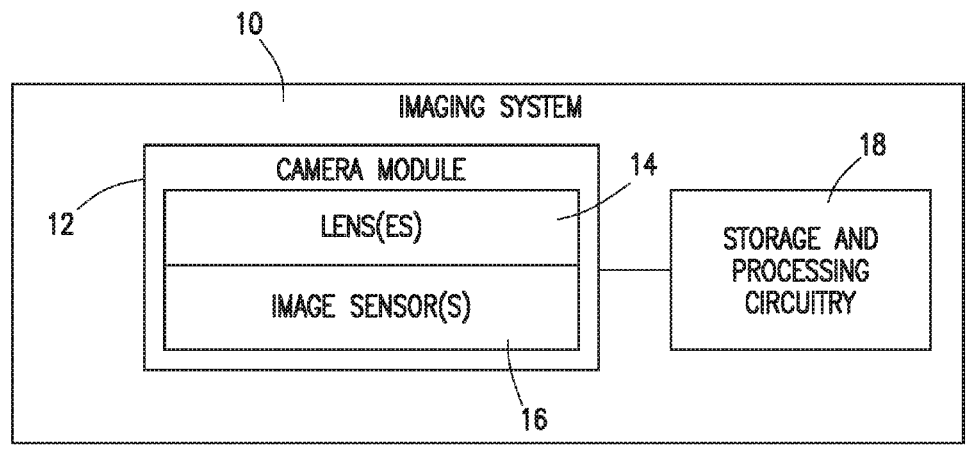
FIG. 1 is a diagram of an illustrative electronic device having an image sensor and processing circuitry for capturing images using an array of image pixels in accordance with an embodiment.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18.

Figure 2:
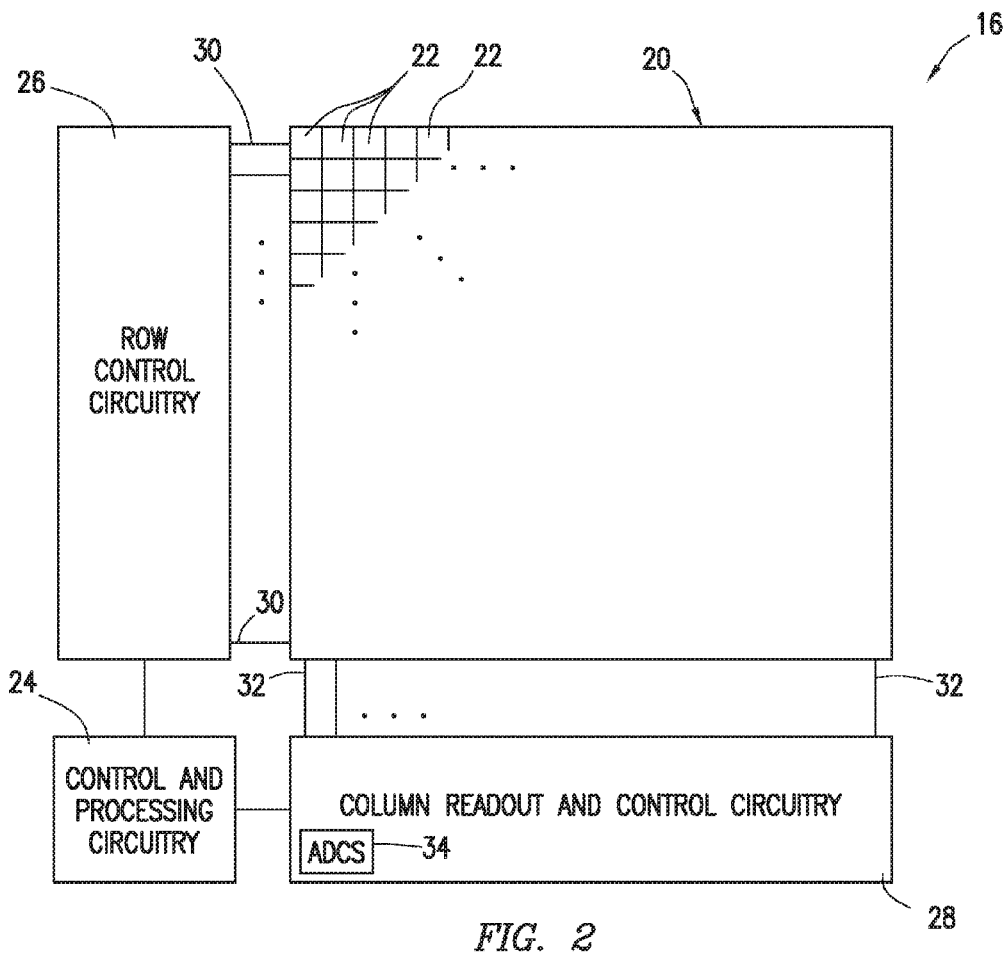
FIG. 2 is a diagram of an illustrative pixel array coupled to analog-to-digital converter circuitry in accordance with an embodiment.

As shown in FIG. 2, image sensor 16 may include a pixel array 20 containing image sensor pixels 22 arranged in rows and columns (sometimes referred to herein as image pixels or pixels) and control and processing circuitry 24. Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry). Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital converter (ADC) circuitry such as circuitry 34, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry 34 in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) for pixels in one or more pixel columns.

If desired, image pixels 22 may include one or more photosensitive regions for generating charge in response to image light. Photosensitive regions within image pixels 22 may be arranged in rows and columns on array 20. Pixel array 20 may be provided with a color filter array having multiple color filter elements which allows a single image sensor to sample light of different colors. As an example, image sensor pixels such as the image pixels in array 20 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another suitable example, the green pixels in a Bayer pattern are replaced by broadband image pixels having broadband color filter elements (e.g., clear color filter elements, yellow color filter elements, etc.). These examples are merely illustrative and, in general, color filter elements of any desired color and in any desired pattern may be formed over any desired number of image pixels 22.

ADC circuitry 34 may include dual slope converter circuitry, for example. In general, ADC circuitry 34 may include any desired type of conversion circuitry. In some scenarios, dual-slope ADC circuitry may have an integrator, comparator, and counter. During the first integration period, from an integrator common-mode level, the integrator may integrate analog image signals for a period of time, which may determine the bit resolution of the conversion. In a second integration period, from the integrator voltage level at the end of the first integration period, the same integration operation is performed but in the opposite direction (e.g., polarity) to the first integration by using a reference signal of opposite sign to the analog image signal. The second integration may stop when integrator output INT_OUT crosses the comparator common-mode level. The durations of both the first and second integration periods (e.g., T1 and T2) may be digitized. Analog voltage $V_{IN}$ and reference voltage $V_{REF}$ may be applied to a first input of integrator 58 during first and second integrations period T1 and T2, respectively. Since analog voltage $V_{IN}$ and reference voltage $V_{REF}$ are proportional to the integration periods T1 and T2 respectively, the input voltage may be determined as $V_{IN}=V_{REF}*(T2/T1)$. While T1 and T2 may be digitized by the same frequency, the input analog value $V_{IN}$ may be calculated regardless of frequency variation. This frequency-variation-independent conversion property may serve a large benefit in image sensors, where multiple column ADCs (e.g., hundreds or thousands) run parallel. Resultant digital data are obtained using a ratio of the durations of the first and second integration periods. The resultant digital data may be output by the counter while the counter is clocked using rising or falling edges of a clock signal. Clocking the ADC using rising or falling edges of a clock signal may limit the speed with which the ADC converts analog image signals into digital image data. If desired, ADC circuitry 34 may include phase delay circuitry for performing phase delay counting. Performing phase delay counting may improve the conversion speed of ADC circuitry 34 relative to scenarios where rising or falling edges of a clock signals are used to perform counting.

Figure 3:
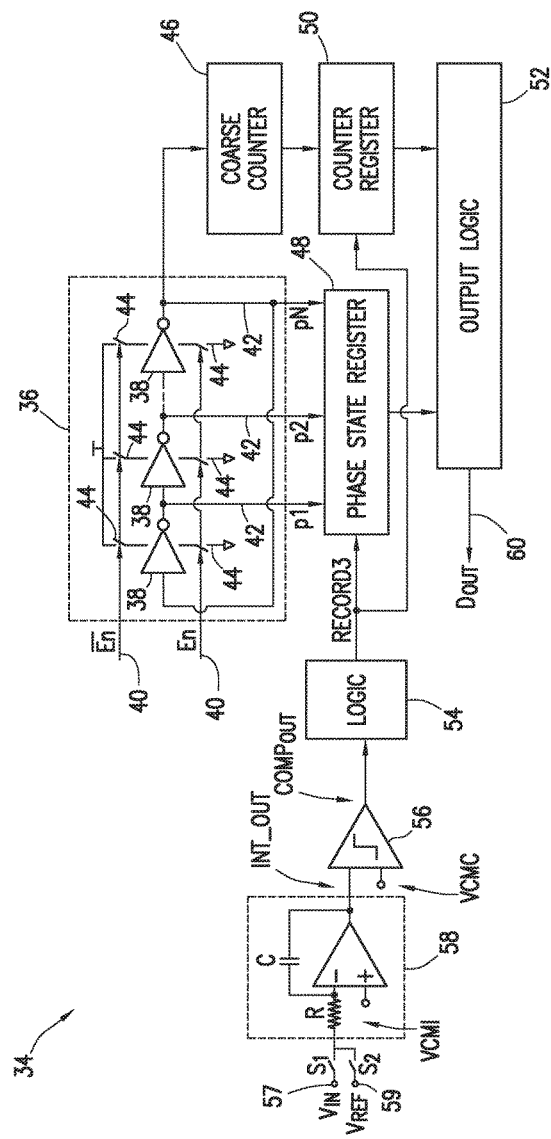
FIG. 3 is a block diagram of illustrative analog-to-digital converter circuitry that performs phase delay counting in accordance with an embodiment.

FIG. 3 is a block diagram showing how ADC circuitry 34 may include circuitry for performing phase delay counting. As shown in FIG. 3, ADC circuitry 34 may include oscillator circuitry such as gated ring oscillator (GRO) 36, whose phases may be frozen and memorized by disconnecting the inverters 38 from the power and the ground. ADC circuitry 34 may be, for example, a dual-slope analog-to-digital converter (DS-ADC) that performs phase delay clocking (e.g., using GRO 36). ADC 34 may include integrator circuitry such as integrator 58, comparator circuitry such as comparator 56, logic circuitry such as logic 54, register circuitry such as phase state register 48 and counter register 50, counter circuitry such as coarse counter 46, and output logic circuitry such as output logic 52.

ADC circuitry 34 may receive an analog input signal $V_{IN}$ at input terminal 57 and may convert analog input signal $V_{IN}$ into a corresponding digital pixel value DOUT. Input signal $V_{IN}$ may be, for example, an analog pixel signal received from pixel array 20. Input terminal 57 may be coupled to integrator 58 through switch S1. Input terminal 59 may be coupled to integrator 58 through switch S2. ADC 34 may receive reference voltage $V_{REF}$ at terminal 59. Switches S1 and S2 may couple their respective input terminals 57 and 59 to a first (e.g., negative) input of integrator 58. A common-mode voltage VCMI may be received at a second (e.g., positive) input of integrator 58. Integrator 58 may include a resistor with resistance R, a capacitor with capacitance C and an operation amplifier. Integrator 58 may output an integrated signal INT_OUT to a first (e.g., positive) input of comparator 56.

Comparator 56 may receive common-mode voltage VCMC at a second (e.g., negative) input. This voltage maybe the same to the common-mode voltage VCMI of the integrator. Comparator 56 may compare integrated voltage INT_OUT to the comparator common-mode voltage VCMC and may output a comparator output signal COMPOUT to an input of logic circuitry 54. Comparator output signal COMPOUT may, for example, be at a logic high level if INT_OUT is greater than VCMC or may be at a logic low level if INT_OUT is less than VCMC. Logic circuitry 54 may perform logical operations on comparator output signal COMPOUT. The output of logic circuitry 54 may be coupled to the input of phase state register 48 and to an input of counter register 50. Logic circuitry 54 may, for example, transmit a logic output signal RECORD3 to registers 50 and 48.

In order to calculate the input analog value $V_{IN}$, integration periods T1 and T2 may be digitized by a phase delay counting method, in which the coarse part is converted by rising edges of a phase node of GRO 36 and a fine counting part is achieved by the phase states of that GRO. Regarding the phase states in the fine counting part, the outputs of GRO circuitry 36 may be coupled to inputs of phase state register 48. GRO circuitry 36 may provide a phase state signal p to the inputs of phase state register 48. Phase state signal p may include a number of corresponding phase nodes p1, p2, . . . , pN. that collectively identify a particular phase state for GRO 36. The change of the phase states of GRO 36 during the measured period may serve to calculate a fine value of ADC 34. However, since the measured period may be much longer than one period of phase states (e.g., the period of the oscillated frequency of GRO 36), phase state information may not be enough for the conversion. Therefore, a conventional rising/falling counter which is triggered by a phase node of GRO 36 may serve to determine the coarse value. The output of coarse counter 46 may be coupled to counter register 50.

The outputs of registers 48 and 50 may be provided to inputs of output logic 52. Phase state register 48 may store a particular phase state for GRO 36 (e.g., as identified by a corresponding signal p) and may output the phase state (e.g., phase state signal p) to output logic 52 when triggered by logic output RECORD3. Counter register 50 may store a coarse counter signal output by coarse counter 46 and may output the coarse counter signal to output logic 52 when triggered by logic output RECORD3. Signal RECORD3 may sometimes be referred to herein as a phase state recordation control signal. Phase states of GRO 36 may be recorded twice, once before the integration period and once at the end of that integration period (e.g., the rising edge of signal RECORD3). The fine conversion value may be calculated by identifying the difference between the two phase states. Output logic 52 may perform output logic operations to generate digital data output DOUT based on the outputs of registers 48 and 50.

Oscillator circuitry 36 may include a number N of delay stages. Each delay stage may include corresponding switches 44 and a corresponding inverter circuit 38. Switches 44 may be controlled using enable control signals En received over control lines 40. A signal may sequentially pass through the stages of oscillator 36. Each stage may impose a corresponding delay on the signal. Each output node of inverter 38 may indicate a corresponding phase in a particular phase state sent to phase state register 48 over data lines 42. The particular phase states may be used to determine the fine value for ADC 34, where the delay value of each state is indicative of the precision of the timing and may be the LSB of the timing conversion as well. A higher number of N delay stages may help to reduce the speed of coarse counter 46, however, at the cost of using a larger area for the extra hardware in phase state register 48. By reducing the speed of coarse counter 46, power consumption of ADC 34 can be lowered relative to an ADC with only rising/falling edge counting.

Each phase node pi (sometimes referred to herein as phase bit pi or bit pi), where i is from 1 to N, of phase state signal p may be delayed in time with respect to the previous phase node p(i−1), where i−1 is from N to N−1, of phase state signal p using a corresponding delay stage in oscillator 36. For example, a first delay stage of oscillator 36 (e.g., a first inverter 38) may output a first phase node p1 of phase state signal p, a second stage of oscillator 36 (e.g., a second inverter 38) may output a second phase node p2 of phase state signal p that is inverted and delayed with respect to signal p1, an Nth stage of oscillator 36 may output an Nth phase node pN of phase state signal p that is delayed with respect to signal p(N−1), etc. The example in which each delay stage includes inverters 38 is merely illustrative. In general, any desired delay circuitry of single-end and differential stages may be used.

If desired, each of the delay stages may be selectively enabled and disabled (e.g., by asserting control signals En) to conserve power. Coarse counter circuit 46 may receive any one of the phase nodes pi of phase state signal p from the output of the corresponding delay stage of oscillator 36. Coarse counter circuit 46 may output a coarse counter signal to counter register 50. For example, counter circuit 46 may assert the coarse counter signal provided to register 50 when a rising or falling edge of phase bit pN is received. In the example of FIG. 3, coarse counter 46 receives the Nth phase node pN of signal p from the output of the Nth delay stage of oscillator 36. In general, counter 46 may receive any of the phase nodes of signal p. Coarse counter 46 may assert a counter output signal (e.g., a digital signal having a logic value "1") when a rising edge of phase bit pN is received, for example.

ADC 34 may perform analog-to-digital conversion for analog signals $V_{IN}$ using first and second sequential integration periods. The first integration period may begin when switch S1 is closed to provide signal $V_{IN}$ to the first input of integrator 58 and may end when input signal $V_{IN}$ is decoupled from integrator 58 (e.g., by opening switch S1). The duration of the first integration period (e.g., a first integration time T1), which may be fixed (e.g., predetermined), may determine the resolution of the conversion. The second integration period may begin when switch S2 is closed to provide signal $V_{REF}$ to the first input of the integrator 58 and may end when reference signal $V_{REF}$ is decoupled from integrator 58 (e.g., by opening switch S2). If desired, switches S1 and S2 may be toggled open or closed for multiple sampling. Phase state signals p (e.g., the particular phase state identified by signals p) may identify the beginning and the end of the second integration period when the integrator output INT_OUT crosses the comparator common-mode voltage VCMC (e.g., the rising edge of signal RECORD3). In the multiple sampling operation, at the end of the second integration period, a subsequent first integration period may begin for the next portion of input signal $V_{IN}$ that has yet to be converted to a digital signal. In this way, ADC 34 may cycle between the first and second integration periods until the entirety of input signal $V_{IN}$ is integrated and processed (e.g., converted to a corresponding digital signal).

During the first integration time of ADC 34, switch S1 may be closed whereas switch S2 is open. The input voltage $V_{IN}$ is received at the first input of integrator 58. Integrator 58 may output signal INT_OUT based on input signal $V_{IN}$ (e.g., an integrated version of signal $V_{IN}$). Comparator 45 may compare integrated signal INT_OUT to common-mode voltage VCMC. When integrator output INT_OUT crosses common-mode voltage VCMC (e.g., when output INT_OUT becomes greater than VCMC), comparator 56 may output COMPOUT at a logic high level. Logic block 54 may generate logic output signal RECORD3 based on comparator output COMPOUT. Logic output signal RECORD3 may store the current phase state p of GRO 36 onto phase state register 48. Simultaneously, signal RECORD3 may stores the outputs of coarse counter 46 onto counter register 50. The stored phase state and coarse counting values may be both applied to output logic 52 to send out for further calculation or to calculate the digital values on-chip.

The signals input to output logic 52 may include phase state information (e.g., delay phase states), which may be the fine part of the conversion, and the coarse counter output, which may be the coarse part of the conversion. The information of both these fine and the coarse parts may identify the first integration period timing T1 and the second integration period timing T2. Using this timing information (e.g., the outputs of registers 48 and 50), logic 52 may compute or send out the data in form of DOUT for further computation of the durations integration periods (T1 and T2) and then the digital value of $V_{IN}$ with respect to the known reference voltage $V_{REF}$.

Figure 4:
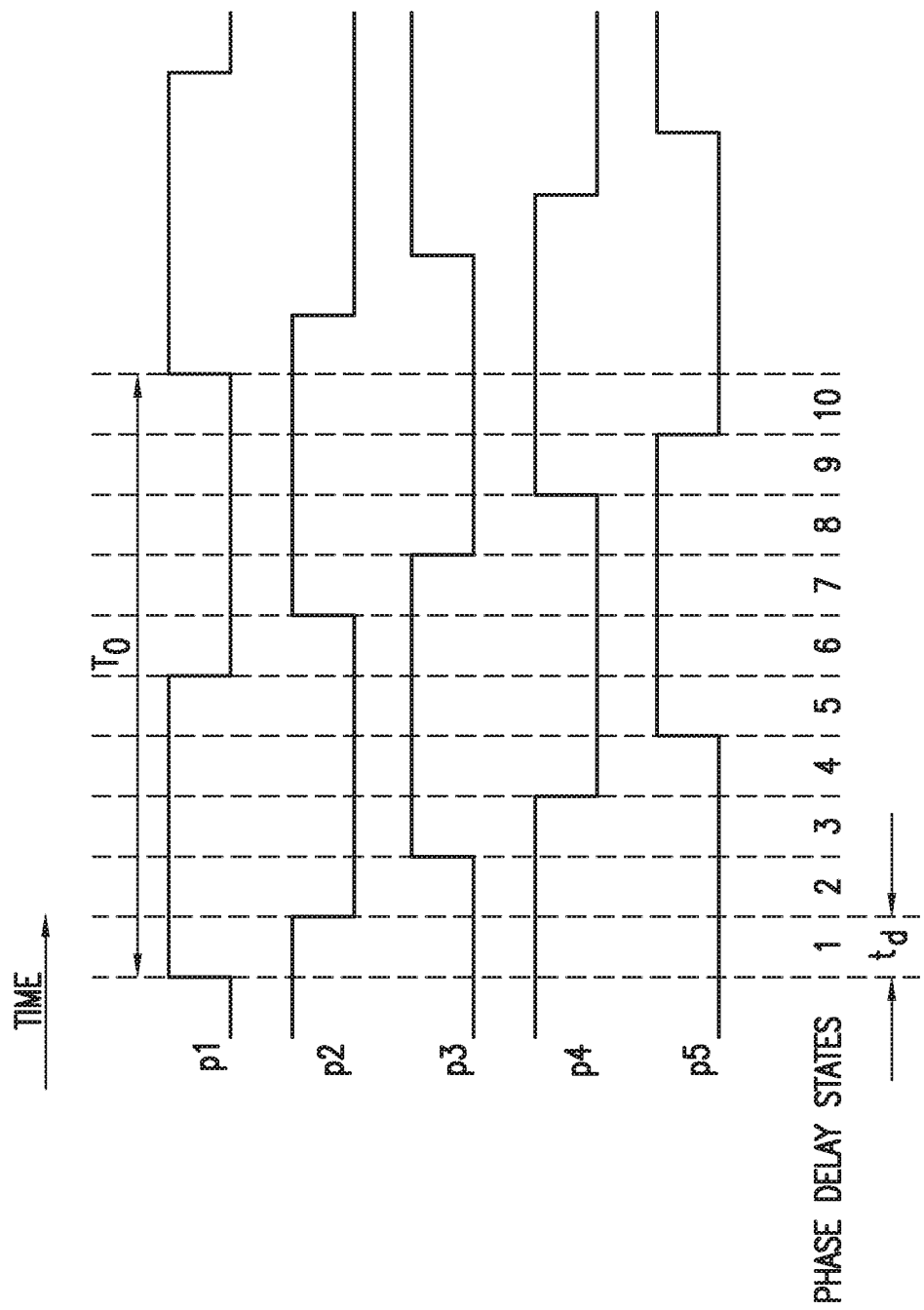
FIG. 4 is an illustrative timing diagram showing how analog-to-digital converter circuitry of the type shown in FIG. 3 is operated using phase state signals in accordance with an embodiment.

FIG. 4 is a timing diagram showing one of many possible configurations for the generation of phase state signal p by GRO 36. In the example of FIG. 4, GRO 36 outputs a phase state signal p that includes 5 phase nodes (e.g., phase nodes p1, p2, p3, p4, and p5). Each phase node is delayed using a respective one of five different inverter stages 38. Each phase node of signal p may be delayed with respect to the previous phase node. As an example, each phase node of signal p may be delayed by a delay time $t_d$ of 150 ps or less relative to the previous phase node of signal p. The clock cycle $T_0$, equivalently the period of GRO 36 may be 10 times the delay $t_d$, for example. Therefore, period $T_0$ may be 1.5 ns or equivalent to a frequency of 666 MHz. These examples are merely illustrative and, in general, any desired delay time and period may be used.

In the example of FIG. 4, phase state register circuitry 48 may include a 5-bit register that receives phase bits p1, p2, p3, p4, and p5. A so-called "pulse width" of the input signal $V_{IN}$ and reference signal $V_{REF}$ may be integrated during the first and second integration periods, respectively. To digitize the pulse width of integrator inputs $V_{IN}$ and $V_{REF}$, phase state register 48 may be triggered at the starting and stopping moments of each pulse width so that the GRO phase states of these nodes are recorded in digital form. As examples, phase delay state 1 in FIG. 4 may be characterized by <p1, p2, p3, p4, p5>=<1, 1, 0, 1, 0>, phase delay state 2 may be characterized by <p1, p2, p3, p4, p5>=<1, 0, 0, 1, 0>, etc.

In some scenarios, the measured pulse widths may be larger than GRO period $T_0$ (sometimes referred to herein as a phase period $T_0$ or clock cycle $T_0$ of the GRO). As a result, the phase delay states may not have a sufficient size to identify events (e.g., when INT_OUT crosses VCMC) that occur outside of the period of time spanned by the phase delay states (e.g., circuitry 34 may need more than ten states to time an event occurring at an unmarked $11^{th}$ state). Therefore, ADC 34 may include an additional counter operating at a frequency associated with clock cycle $T_0$ such as coarse counter 46.

In scenarios where the timing of ADC 34 is controlled by counting rising/falling edges of a clock signal, the clock cycle is occupied by a single phase state. However, when phase-delay counting is used as shown in FIG. 3, the clock cycle may be occupied with 10 phase states, for example. This may allow ADC 34 to operate with a conversion speed that is 10 times greater than ADCs that count rising/falling edges of a clock signal while the power consumption is more or less the same. For example, ADC 34 may operate at a speed of 6.66 GHz, whereas conventional ADCs that count rising/falling edges of a clock signal may operate at a speed of 666 MHz. As GRO period $T_0$ is 10 times greater than phase delay $t_d$, the resolution of conversion may be increased by 3.3 bits under the same conversion time, if desired. These examples are merely illustrative and, in general, GRO period $T_0$ may be any larger-than-one multiple of the delay $t_d$ to achieve a faster conversion time.

Figure 5:
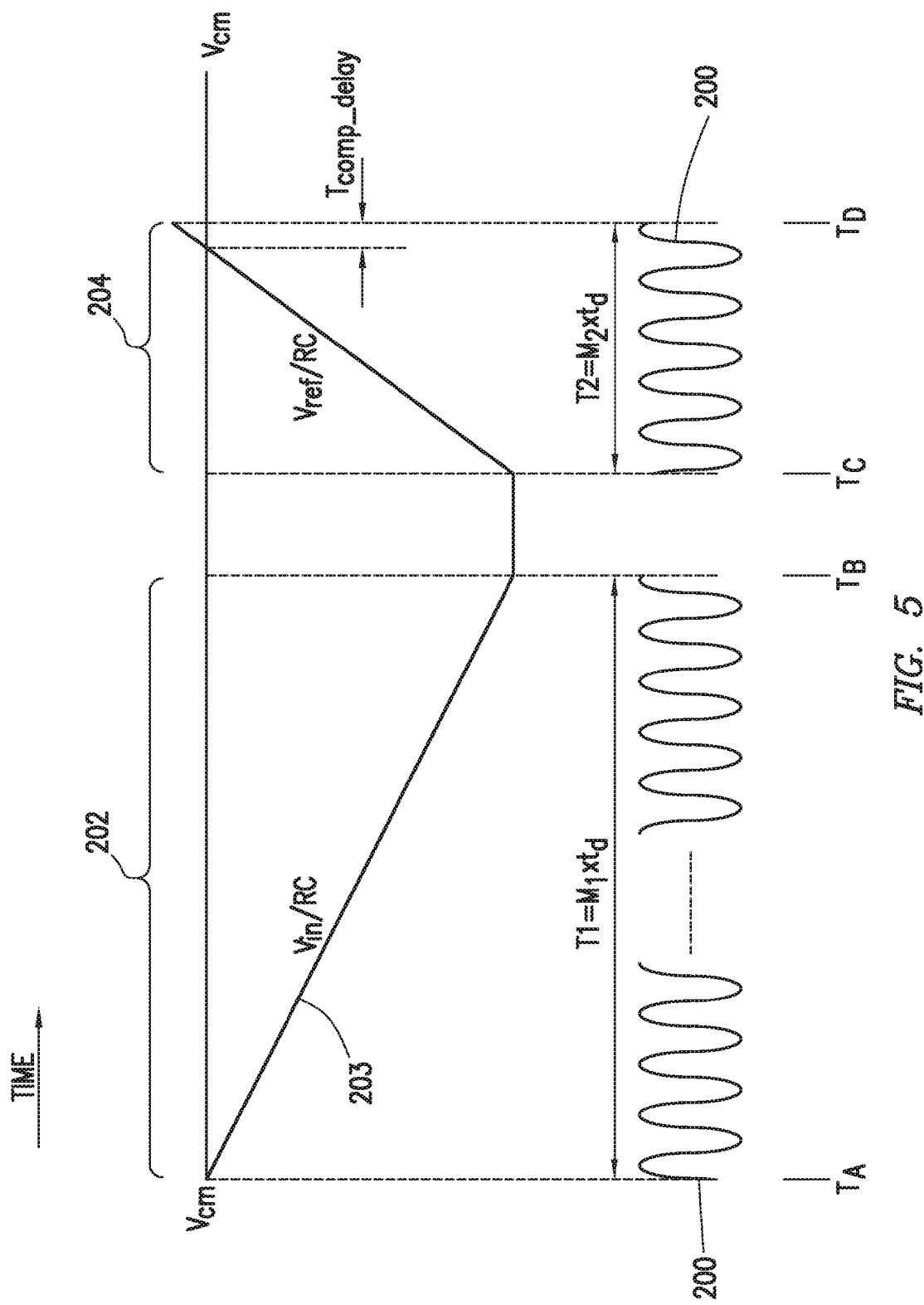
FIG. 5 is an illustrative timing diagram for operating a phase delay counting analog-to-digital converter of the type shown in FIG. 3 in accordance with an embodiment.

FIG. 5 shows an example of a timing diagram for ADC 34 utilizing phase delay counting of the type shown in FIG. 3. At time $T_A$, switch S1 may be closed to begin first integration period T1. At time $T_B$, switch S1 may be opened to end first integration period T1. At time $T_C$, switch S2 may be closed to begin second integration period T2. At time $T_D$, switch S2 may be opened to end second integration period T2. The phase of GRO 36 is shown by waveform 200. In general, one entire GRO period $T_0$ may be used as a coarse counter period. Each subdivision of the entire GRO period may be used as a phase state with delay $t_d$ as the period of the phase state.

Curve 203 shows INT_OUT for sample input Vin. Curve 203 may have portions 202 and 204. Portion 202 of INT_OUT may have a first slope Vin/RC during the first integration period. Portion 204 of INT_OUT may have a second slope Vref/RC during the second integration period. As mentioned previously, the second integration period ends when INT_OUT crosses Vcm. In this scenario, the common-mode voltages of integrator 58 and comparator 56 are the same and equal to Vcm. Alternatively, these values may sometimes differ from each other. However, there may be non-idealities such as delays (e.g. delay $T_{comp\_delay}$ that occurs because it takes time to for comparator 56 and logic 54 to respond).

When time T1 is digitized, it may be useful to interpret the time as multiples of stage delay $t_d$, which is effectively the length of a period of a phase state in GRO phase waveform 200. By this interpretation, integration time T1 spans $M_1$ phase delays in waveform 200, and analogously, integration time T2 spans $M_2$ phase delays of GRO 36. By characterizing the first and second integration times T1 and T2 in terms of M1 and $M_2$, respectively, the equation $V_{IN}/V_{REF}=(t_dM_2)/(t_dM_1)=M_2/M_1$ may be utilized to calculate the value of $V_{IN}$. The ratio $V_{IN}/V_{REF}$ may be independent on the value $t_d$, which may vary among ADCs if arranged in columns of image sensors. $M_1$ may determine the number-of-bit resolution of the conversion. For a fixed resolution conversion, the smaller the phase delay value $t_d$ is, the shorter the period T1 is, and as a sequence, the total conversion time is shorter. Digital output DOUT may be based on the value of $V_{IN}$ calculated in this way. Alternatively, digital output DOUT may be raw data that includes information on values $M_2$ and $M_1$.

Since ADC 34 may be parallel arranged in column level with the phase delay $t_d$ variation because GRO 36 may be dedicated for one ADC or multiple ADCs, value $M_1$ may vary among columns. However, such variation only introduces resolution variation, which may be tolerable in imaging systems.

Figure 6:
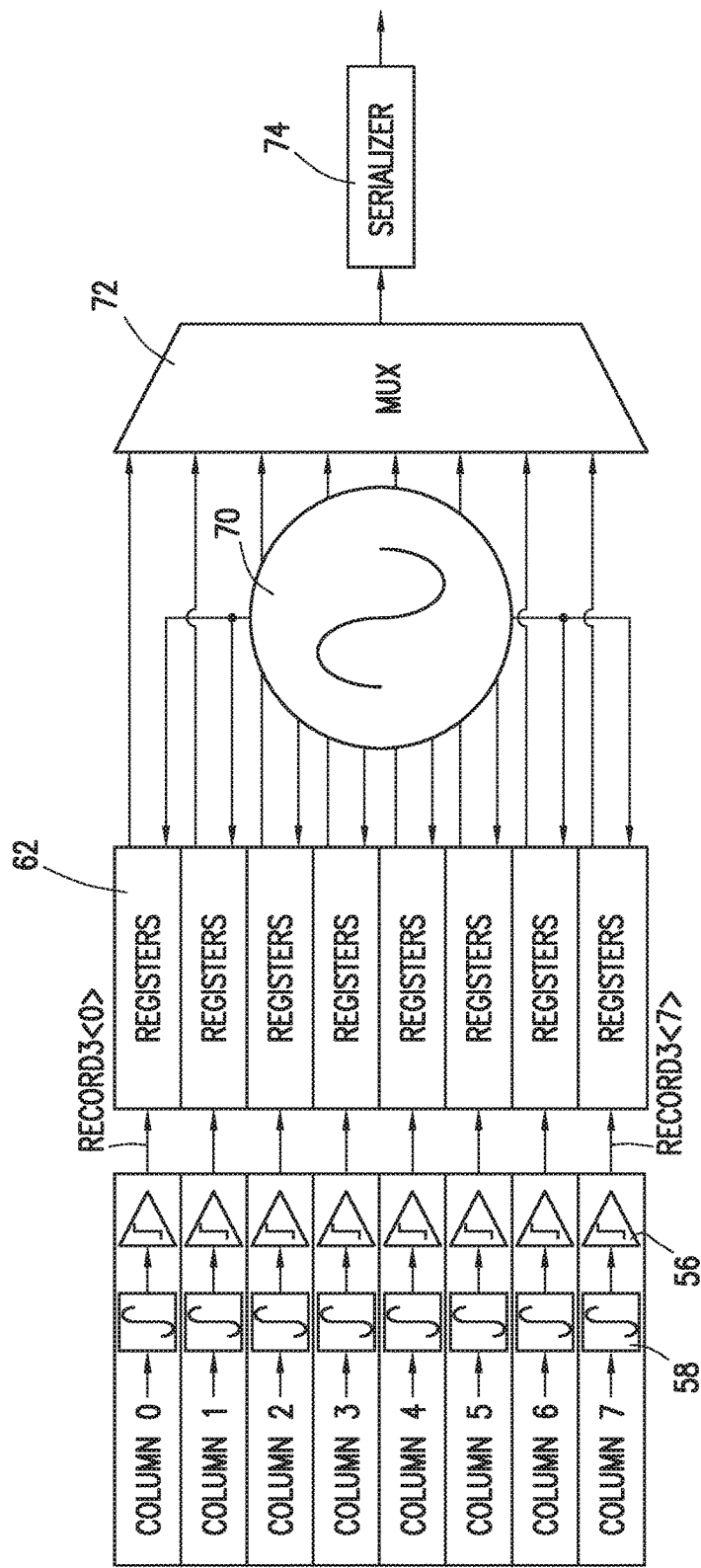
FIG. 6 is a block diagram showing how a single gated ring oscillator may be shared by analog-to-digital converter circuitry coupled to multiple pixel columns in accordance with an embodiment.

If desired, a single GRO may be shared by ADCs 34 coupled to multiple columns of array 20, as shown in FIG. 6. In the example of FIG. 6, GRO 70 is shared by eight columns of pixels 20. This example is merely illustrative and, in general, GRO 70 may be shared by any desired number of pixel columns.

The eight integrating channels (columns 0, 1, . . . , 7) each have corresponding ADC circuitry (e.g., corresponding integrators 58, comparators 56, and registers 62, which may include, as an example, phase state registers 48, counter registers 50, or any other registers. However, each column may share a single digital back-end that includes the shared GRO 70. The digital back-end may include multiplexer 72 and serializer 74. The operation of GRO 70 may similar to that of ADC 34 as described in FIG. 3. However, the outputs of GRO 70 may need to be buffered to eight register groups, included in registers 62. GRO 70 may continue operating until the last logic output signal RECORD3 triggers the corresponding registers 48 and 50 to record the relevant states. Multiplexer 72 may gather the outputs of registers 62 and sends the outputs to serializer 74 for serialization. Serializer 74 may serialize the outputs and provide the outputs to other processing circuitry. By sharing GRO 70 across pixel columns, more space (e.g., chip area) may be made available for the layout of GRO 70 relative to scenarios where each column includes a respective GRO, which may result in improved isolation.

In an ADC of the type shown in FIG. 3, in order to complete a signal conversion, the first integration time may be digitized by the phase state and/or coarse counter value in order to detect the number of periods $M_1$ in FIG. 5. The only period when the GRO is not enabled is between the first and second integrations. This approach consumes a significant amount of power because the GRO is enabled during most of the conversion time. As shown in shared GRO phase waveform 206 of FIG. 7, GROs of the type shown in FIG. 3 may be selectively enabled during the second integration time only to reduce power consumption, as an example. A GRO of any type (e.g. GRO 70 shown in FIG. 6) may be configured to use this control scheme to minimize power consumption if desired. The GRO may be enabled during the second integration to ensure that the last integrator output crosses the common-mode level while GRO phases are still running.

This timing may also be applied in scenarios where the GRO is shared by multiple pixel channels, described in FIG. 6. The inclusion of the channels does not affect GRO operation because the output of the GRO delay stages may be buffered before being fed to registers to accommodate for any timing inconsistencies that may occur. In scenarios where the GRO is shared by multiple channels, the conversion equation may be given by $V_{IN}<i>/V_{REF}=N_i/(kN_{10})$ for the ith input signal $V_{IN}<i>$ for the corresponding ith channel (column), where the value $N_i$ is the number of phase delay values $t_d$ within the second integration period of channel I, and fixed value k is a ratio of the duration of first integration period T1 to the period when the GRO is enabled, labeled as $N_{10}$ and equivalently, T1+$T_{fixed}$, in FIG. 7, for example. The enable period T1+$T_{fixed}$ of GRO 36 during the second integration period is to ensure that the last moment when integrator outputs crosses the comparator common-mode level happens while GRO 36 is still enabled. As examples, Channel$_i$ integrator output 208 and Channel$_j$ integrator output 210 may produce digitized values $N_i$ and $N_j$, generated by the shared GRO Phase to be outputted to registers 62.

Figure 7:
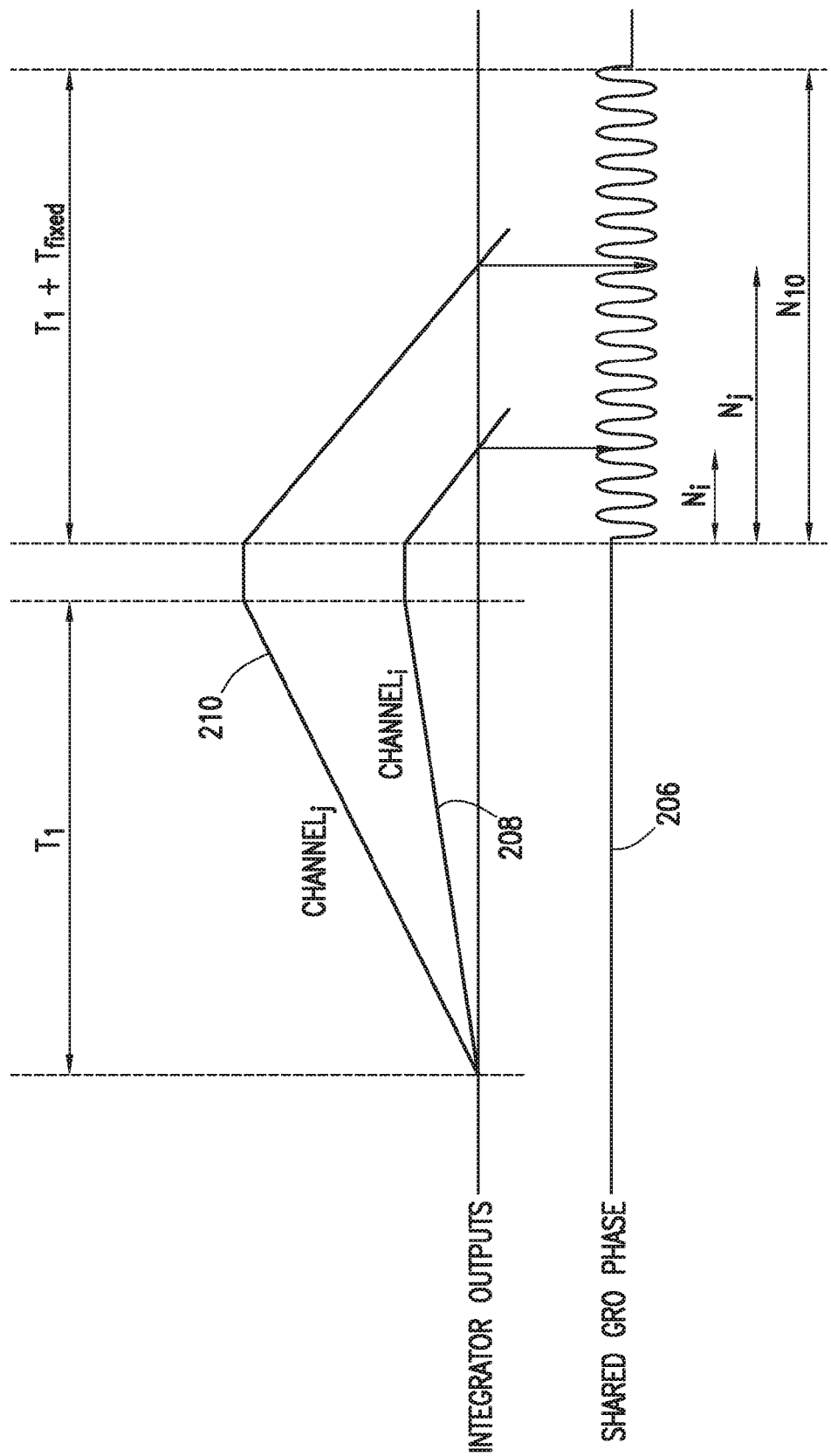
FIG. 7 is an illustrative timing diagram for operating analog-to-digital converter circuitry having a shared gated ring oscillator of the type shown in FIG. 6 in accordance with an embodiment.
Figure 8:
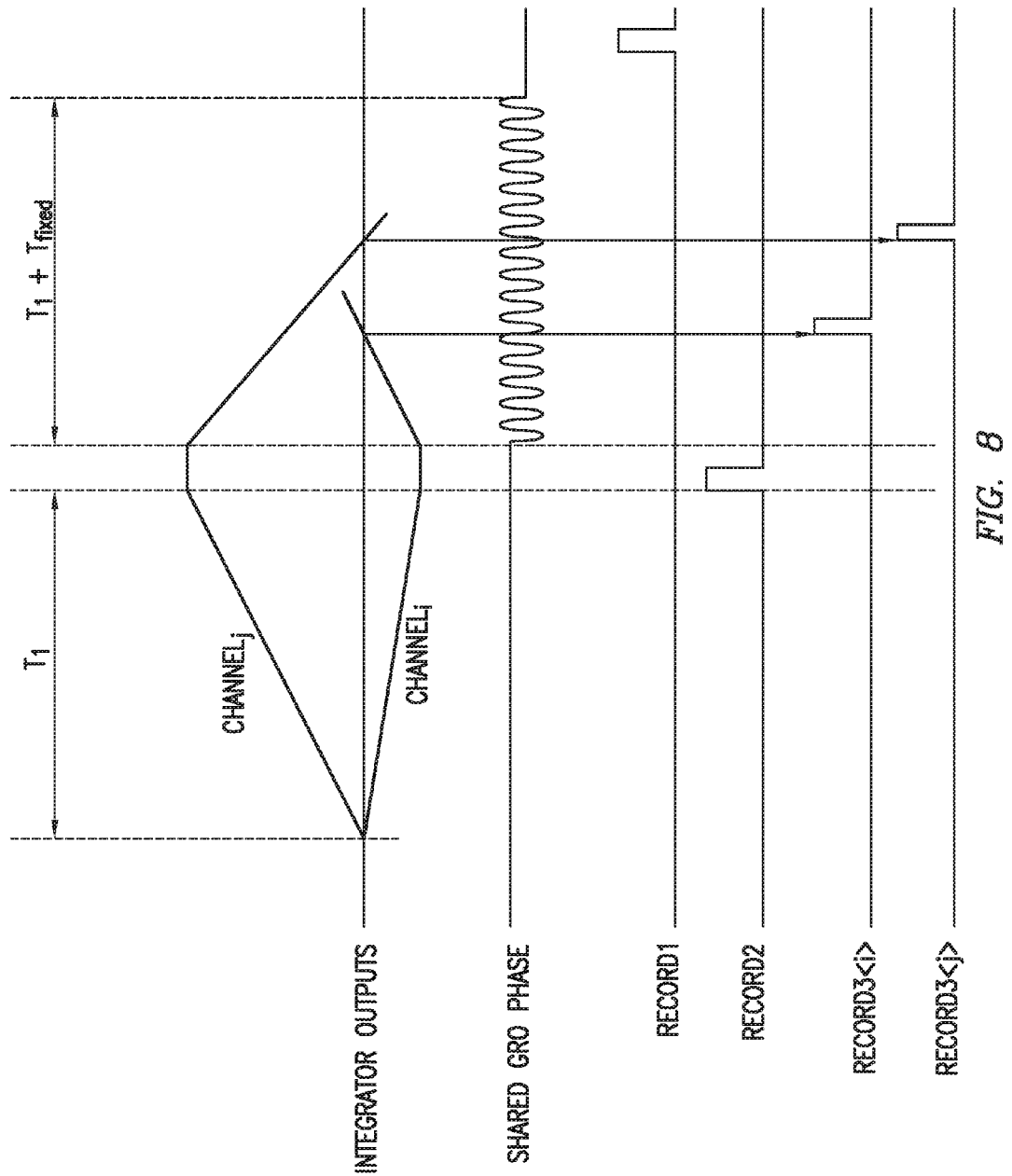
FIG. 8 is an illustrative timing diagram for demonstrating the relative timings of the data lines used to trigger recordings of data from the shared gated ring oscillator to the registers in accordance with an embodiment.

FIG. 8 shows another timing diagram for shared GRO 70. In FIG. 8, digital data signals RECORD2 and RECORD1 may trigger registers 62 to record the phase state signal p at the start and end of the second integration period, when shared GRO 70 is disabled, respectively. Digital data signals RECORD1 and RECORD2 may be shared by any number of columns or channels that also shares the same GRO. FIG. 8 also shows the output trigger signal for the ith channel RECORD3<i> and the jth channel RECORD3<j>, where i and j may be any one of the number of channels (columns) supported by GRO 70. The trigger signals RECORD3 sample the phase state and the coarse counter output at the moment their corresponding integrator outputs cross the comparator common-mode level. However, in order to calculate the digital values $N_i$, $N_j$, and $N_{10}$, as shown in FIG. 7, the phase and coarse counter information at the beginning and at the ending of the second integration should be known. Therefore, the two data signals, RECORD1 and RECORD2, which are shared by all channels, may be used to as references.

The digital data signal RECORD2 triggers registers to record the phase state and the coarse counter values at the beginning of the second integration. The coarse counter may be reset some time during the first integration, thereby eliminating the need for a separate coarse counter register to store the coarse counter output at the pulse RECORD2. For example, by subtracting the phase state and coarse counter values in the according register values triggered by the pulse RECORD3<i> from the corresponding register values triggered by the pulse RECORD2, the digitized value $N_i$ in FIG. 7 may be known. Any other digital value $N_j$ and so forth may be obtained using the same process. In order to determine the digital value $N_{10}$, the stored phase state and coarse counter values by the data line RECORD2 may be subtracted from the stored phase state and coarse counter values by the data line RECORD1.

Figure 9:
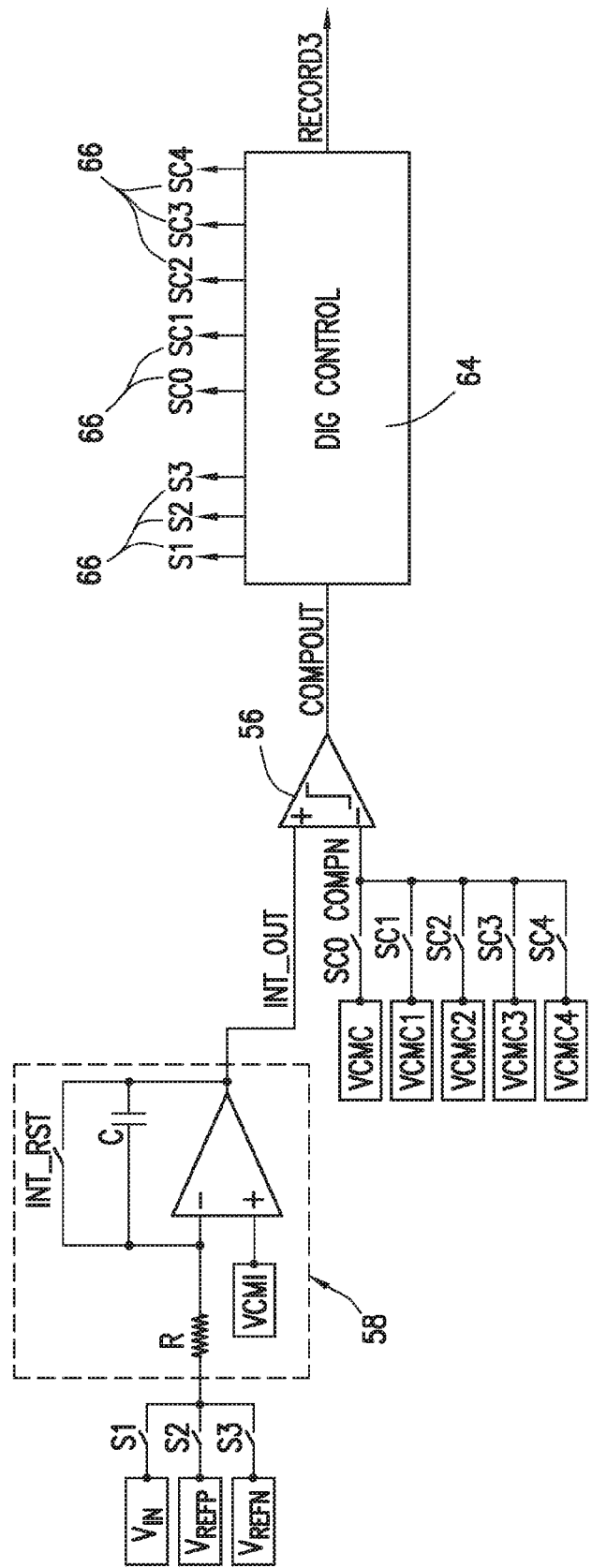
FIG. 9 is a block diagram showing how analog-to-digital converter circuitry of the type shown in FIG. 3 may include multiple comparison voltages and multiple input reference voltages in accordance with an embodiment.

As shown in FIG. 9, the integrator, comparator, and logic block portion of ADC 34 as shown in FIG. 3 may be modified to include multiple input reference voltages such as $V_{REFP}$ and $V_{REFN}$. ADC 34 may also be provided with multiple comparison voltages VCMC, VCMC1, VCMC2, VCMC3, and VCMC4 (for example). The reset switch controlled by signal INT_RST of integrator 58 may be dedicated to reset the integrator output INT_OUT to VCMI level before the first integration. The multiple input reference signals, $V_{REFP}$ and $V_{REFN}$, are coupled to the first terminal of integrator 58. The multiple comparison reference voltages, VCMCs, are coupled to the negative input COMPN of comparator 56. Output INT_OUT of integrator 58 may ramp across all or some of comparison voltages VCMCs to generate rising edges of the RECORD3 pulse to trigger subsequent actions as previously described. The switches for coupling $V_{REFP}$, $V_{REFN}$, VCMC, VCMC1, VCMC2, VCMC3, and VCMC4 to the corresponding terminals are respectively S2, S3, SC0, SC1, SC2, SC3, and SC4. These switches may be used to selectively couple one of signals $V_{IN}$, $V_{REFP}$ and $V_{REFN}$ to integrator 58 and to selectively couple one of signals VCMC, VCMC1, VCMC2, VCMC4, and VCMC4 to comparator 56 at a given time. Voltages $V_{REFP}$ and $V_{REFN}$ may be positive and negative voltages relative to integrator common-mode voltage VCMI (e.g., the common-mode voltages VCMI of integrator 58 and VCMC of comparator 56 may be the same and equal to Vcm), respectively. The positive and negative reference voltages $V_{REFP}$ and $V_{REFN}$ may be used to allow for a dual-polarity operation of ADC 34. The incorporation of multiple-level comparison voltages VCMCs may, for example, allow comparator noise and other thermal noise to be averaged, and may lead to an overall decrease in signal noise for COMPOUT. Digital control block DIG CONTROL 64 may provide control signals 66 that control switches S1, S2, S3, SC0, SC1, SC2, SC3, and SC4 (e.g., that controls which reference voltages are coupled to the corresponding terminals at a given time). This example is merely illustrative and, in general, any desired number of reference voltages and comparison voltages may be used.

Figure 10:
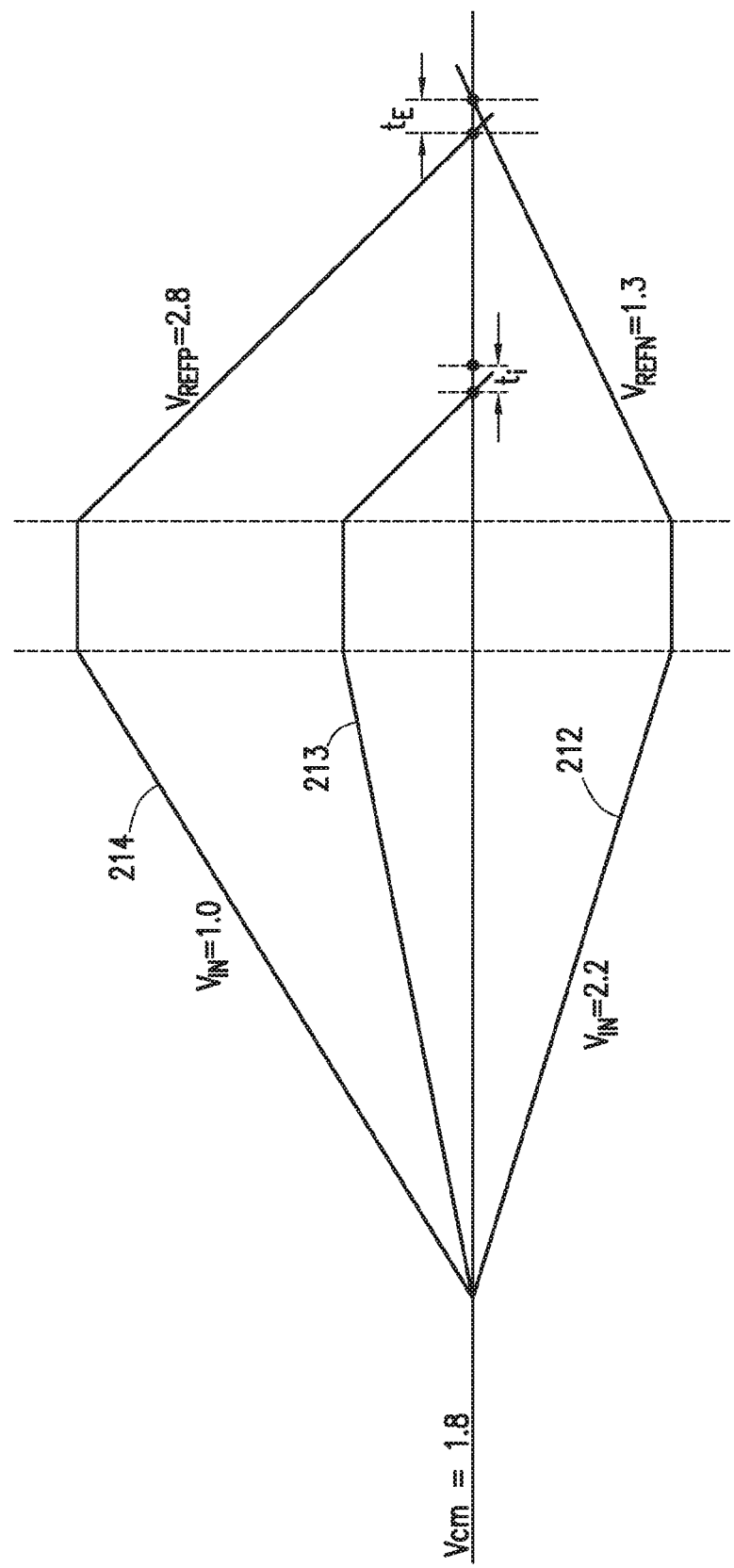
FIGS. 10 and 11 are illustrative timing diagrams for operating an analog-to-digital converter of the type shown in FIG. 9 in accordance with an embodiment.

FIG. 10 is a timing diagram showing the operation of ADC 34 when operated with dual-polarity inputs (e.g., as shown in FIG. 9). Lines 212, 213, and 214 show INT_OUT for various input signal values $V_{IN}$ of positive and negative polarities (sign) relative to common-mode voltage Vcm, which was assumed to be the same as VCMI and VCMC. Reference voltages $V_{REFP}$ and $V_{REFN}$ of opposite polarity (sign) may be used in this scenario. As shown in FIG. 10, negative reference voltage $V_{REFN}$ may be applied when input signal $V_{IN}$ is greater than common-mode voltage Vcm. The reference voltage $V_{REFP}$ may be applied when input signal $V_{IN}$ is less than common-mode voltage Vcm.

Input voltage $V_{IN}$ may be a pixel output received from array 20 or may be a pixel output received from a correlated double sampling buffer/amplifier, for example. When $V_{IN}$ is greater than Vcm, the input may be from low-light signals, for example. Similarly, when $V_{IN}$ is less than Vcm, the input may be from high-light signals. In addition, when receiving high-light signals, the pixels may suffer from photo shot noise. In this case, low noise conversion may not be necessary and conversion accuracy may be relaxed. When receiving low-light signals, the pixels may not be significantly affected by photon shot noise. As a result, it may be necessary to have a low noise conversion in this case. Therefore, this arrangement of reference levels $V_{REFP}$ and $V_{REF}$ may match with the photon shot noise behavior of the corresponding pixel.

However, for the dual-polarity dual-slope conversion, mismatch error $t_E$ may exist due to integrator and comparator non-idealities or imperfection of the reference voltages $V_{REFP}$ and $V_{REFN}$. As an example, FIG. 10 shows that integrator output for when $V_{IN}$=2.2 (line 212) does not cross the common-mode level Vcm at the same point as the integrator output for when $V_{IN}$=1.0 (line 214). Ideally, since the magnitude of the positive reference $V_{REFP}$ relative to Vcm is two times that of $V_{REFN}$ relative to Vcm (in this example), and the same is true of the respective $V_{IN}$ values, lines 212 and 214 should cross the common-mode level at the same time. To compensate for this error $t_E$ and other errors of this type, the negative input range ($V_{IN}$<Vcm) may be calibrated with the positive input range ($V_{IN}$>Vcm). As an example of how to remove the error, line 213 shows mismatch error $t_i$ that may be removed by using mismatch error $t_E$ and by using mismatch error $t_{E2}$ from another set of dual-polarity inputs similar to those generating $t_E$. Mismatch errors $t_E$ and $t_{E2}$ may be used for calibration since they are generated by dual-polarity inputs. Their values are then measured and known. By interpolation or extrapolation, mismatch error $t_i$ may be determined from $t_E$ and $t_{E2}$. When $t_i$ is known, subsequent operations involving line 213 may add known mismatch error $t_i$ to compensate for and remove the error.

Figure 11:
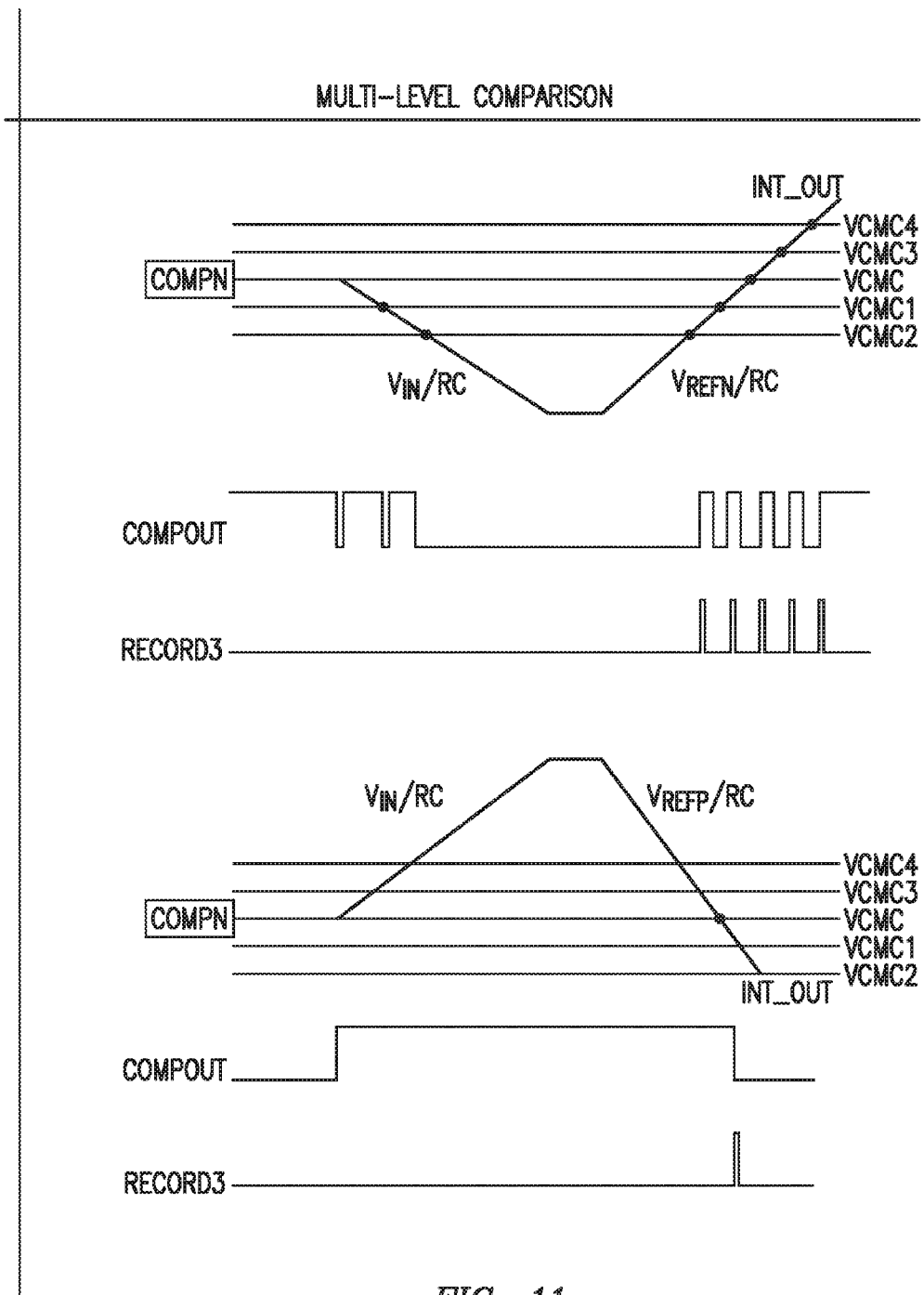

FIG. 11 shows a timing diagram in which multiple comparison voltages are provided (e.g., by selectively coupling different voltages VCMC to the comparator as shown in FIG. 9). In the example of FIG. 11, there are five comparison voltage levels (VCMC, VCMC1, . . . , VCMC4). These comparison voltages may be applied one at a time at the negative input of the comparator. With multiple comparison levels operation, RECORD3 may generate multiple signals (e.g., five signals for five level comparison, two higher voltages VCMC3 and 4, two lower voltages VCMC 1 and 2, and one closest to the correct voltage) all corresponding to one wanted output, the correct time at which second integration ends. Since, for example, all five signals have systematic noise, when they are averaged, some systematic noise (e.g., comparator noise, thermal noise) may be removed, leading to low noise conversion.

As shown in FIG. 11, for the case where $V_{IN}$ is greater than VCMC during the first integration, if the integrator output INT_OUT crosses voltage level VCMC, the negative terminal of comparator 56 is switchably coupled to voltage level VCMC1, and if integrator output INT_OUT crosses voltage level VCMC1, the negative terminal of comparator 56 is switchably coupled to voltage level VCMC2. During the second integration time, the integrator output INT_OUT increases. If integrator output INT_OUT reaches voltage level VCMC2, the signal RECORD3 is pulsed and the negative input of the comparator is switched back to voltage level VCMC1. Similarly, if integrator output INT_OUT crosses voltage level VCMC1, RECORD3 is pulsed a second time and the negative terminal of the comparator connects to voltage level VCMC. The operation is similar when integrator INT_OUT crosses voltage levels VCMC3 and VCMC4. As a result, the logic output signal RECORD3 is pulsed as many as five times. Each of these pulses records the GRO phase state and coarse counter value into registers 48 and 50, respectively.

The negative input of comparator 56 may switch to different comparison voltages during the first integration. In this scenario, during the second integration, the negative input may switch back to those reference voltages in the reverse, then may cross VCMC, and subsequently two additional comparison voltages, VCMC3 and VCMC4, in their respective orders. However, this may occur when $V_{IN}$ is greater than VCMC. In the case where $V_{IN}$ may be less than VCMC, the timing diagram may be the same as in a single level comparison. The reason for applying multiple comparison voltages only when $V_{IN}$ may be greater than VCMC is that if $V_{IN}$ is less than VCMC, the incoming light strength may be relatively high such that photon shot noise is dominant. As a result, there may be no need for sampling with multiple comparison voltages to average out the comparator noise and other thermal noise for achieving a low noise conversion.

Figure 12:
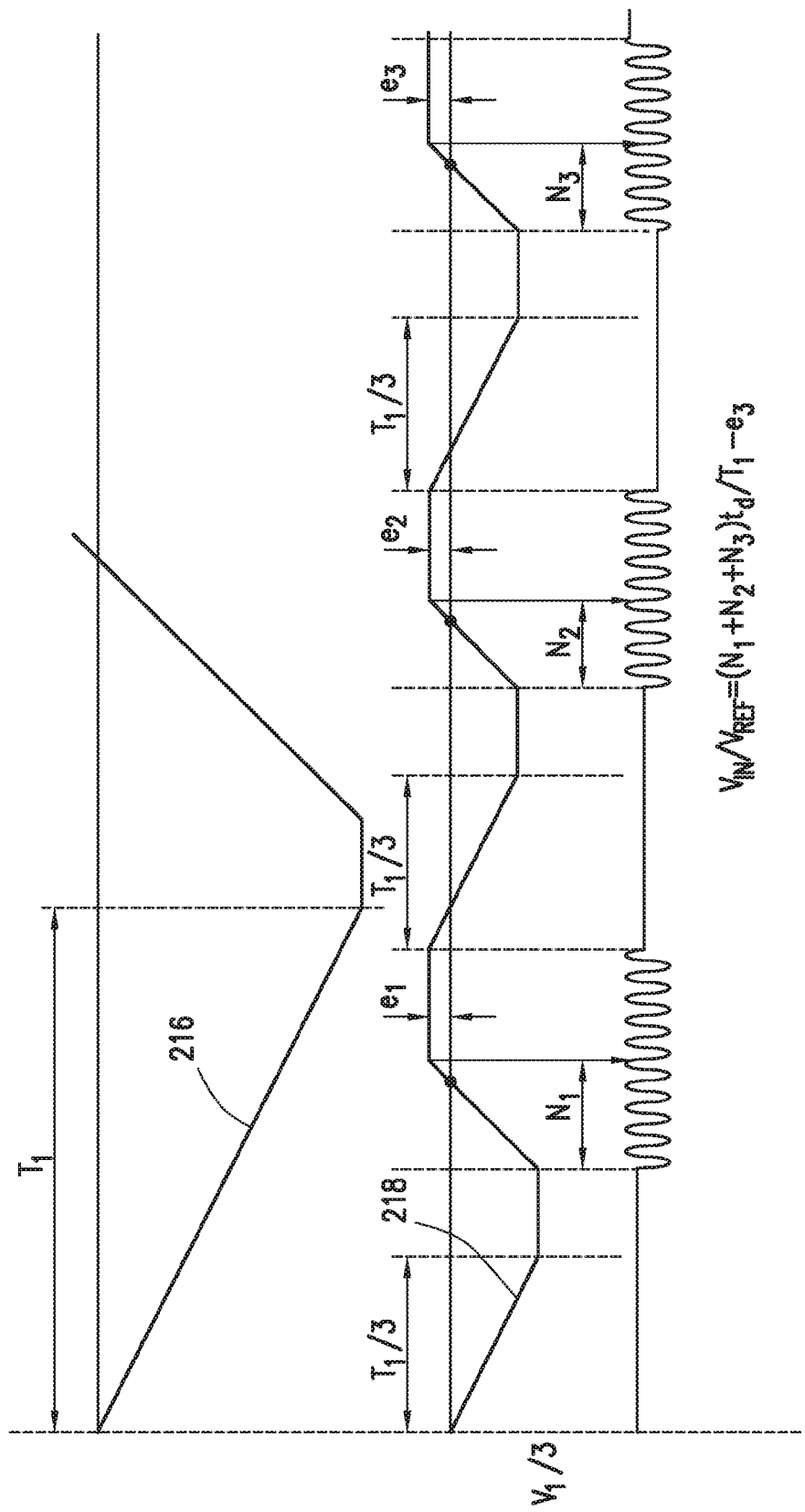
FIG. 12 is an illustrative timing diagram showing how analog-to-digital converter circuitry of the type shown in FIG. 3 may perform fractional integration operations to prevent integrator saturation in accordance with an embodiment.

FIG. 12 shows a timing diagram for ADC 34 to mitigate signal saturation at integrator 58. As shown in FIG. 12, the first integration period T1 may be divided into smaller fractions such as $T_1/3$. Similarly, second integration period T2 may be divided into corresponding thirds (e.g., as labeled $N_1$, $N_2$, and $N_3$ in FIG. 12). Dividing periods T1 and T2 into thirds is merely illustrative and, in general, any desired fraction may be used.

During the first third $T_1/3$ of the first integration time, integrator output INT_OUT may deviate from common-mode level Vcm, as shown by curve 218, to voltage $V_{1/3}$ which is three times smaller than when a complete and continuous first integration time T1 is used, as shown by curve 216. This may prevent saturation of integrator 58, especially in a high resolution scenario where the first integration period T1 needs to be long enough to cover the whole resolution range of the image data. During second integration time portion $N_1$, INT_OUT may approach common-mode level Vcm, from voltage $V_{1/3}$ reached at the end of first integration time portion $T_1/3$. Two more subsequence pairs of first and second integration time portions (e.g., $T_1/3$ with $N_2$ and $T_1/3$ with $N_3$) occur to ensure the total combined first integration time is equal to the complete and continuous first integration time T1.

The first third of the first and second integration periods may be complete when the integrator output crosses the common-mode level after the first third $N_1$ of the second integration period. In practice, a delay may cause the integrator output to stop just beyond the common-mode level Vcm, generating error $e_1$. The next integration period portion $T_1/3$ may begin from this $e_1$ level. After the subsequent portion $N_2$ of the second integration period, the signal may generate corresponding error $e_2$. Similarly, in the third portion, the portion $N_3$ of the second integration period may end at error level $e_3$. A modified version of the previous equations drawn for digitizing input signal $V_{IN}$ is shown as $V_{IN}/V_{REF}=(N_1+N_2+N_3)t_d/T1-e_3$, where $(N_1+N_2+N_3)$ is the digitized value of the combined second integration times in the first, second, and third portions (e.g., $N_1$, $N_2$, $N_3$). Given that $e_3$ may be removed by using digital correlated double sampling operations, digitized $V_{IN}$ can obtained and processed in the same way as mentioned previously.

In the example of FIG. 4, there are ten phase states for a five-delay-stage GRO. In order to utilize phase delay counting, both the phase state counting and the coarse counting may be implemented, as most of the measured pulse widths may be larger than one clock cycle $T_0$ itself. Therefore, coarse counting may be used to determine how many clock cycles $T_0$ the pulse width lasts, where finer precision portions of the signal are calculated by the GRO phase state.

Assume, as an illustration, that of the five GRO phase bits p1, p2, p3, p4, and p5, the phase bit p3 is provided to coarse counter 46. Further assume that the pulse RECORD3 triggers at the third phase state (e.g., when <p1, p2, p3, p4, p5>=<1,0,1,1,0>). Since phase state register 48 may be very fast, the third phase state <1,0,1,1,0> may already be the most current phase state stored in the register 48 and may be ready to send to output logic 52. Register 50 may also immediately have the stored counter output in the counter register (50 of FIG. 3). However, the stored counter output may be the value of the previous clock cycle because even though the phase bit p3 reaches coarse counter 46, the coarse counter may not have updated its output yet due to counter delay. This may create a coarse counting error.

Figure 13:
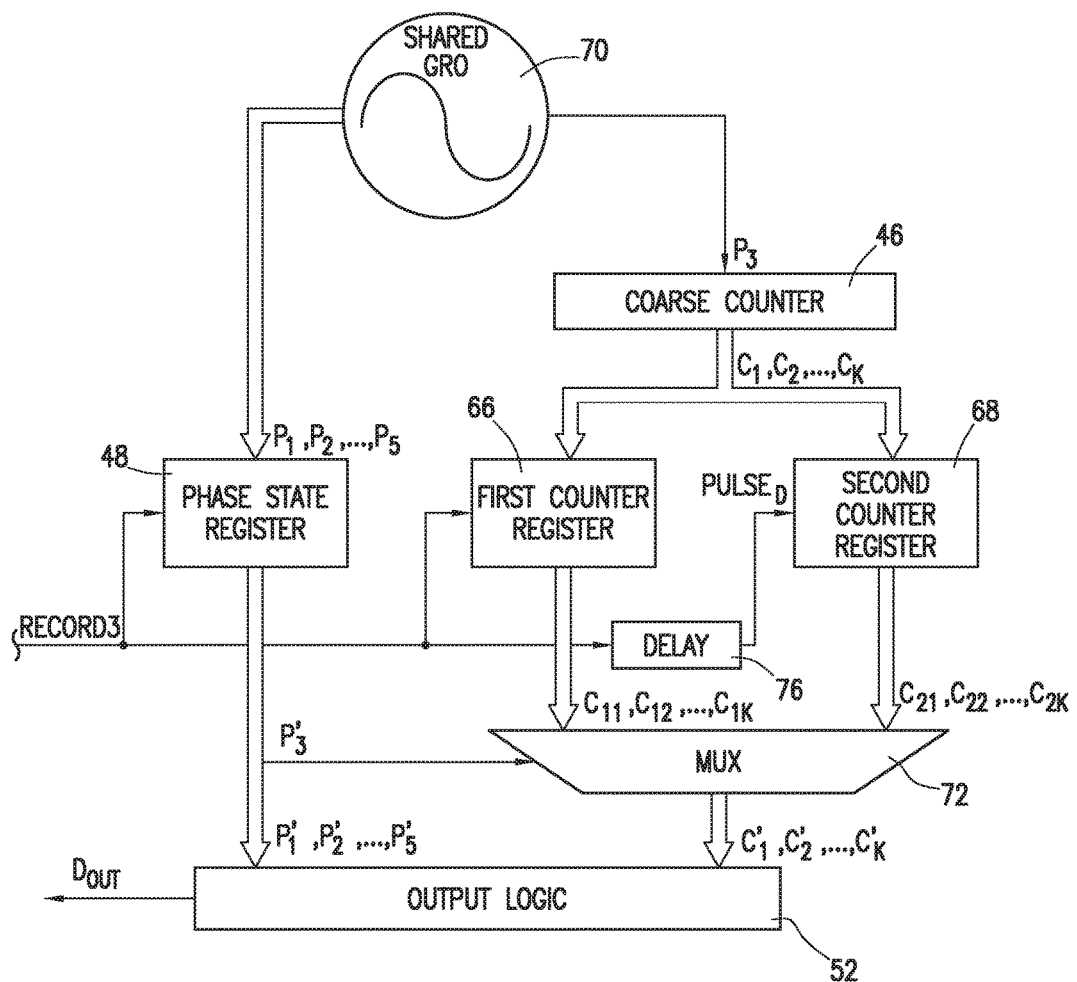
FIG. 13 is a block diagram showing illustrative analog-to-digital circuitry having circuit blocks for implementing a dual-sampling method to remove coarse counting error in accordance with an embodiment.

FIG. 13 shows a block diagram for ADC 34 in which the coarse counting error may be removed. GRO 70 in this example may output phase state signal P having five phase bits $P_1$, $P_2$, $P_3$, $P_4$, and $P_5$ to phase state register 48. Phase state register 48 may output phase state signal P' having phase bits $P'_1$, $P'_2$, $P'_3$, $P'_4$, and $P'_5$ to output logic 52 when triggered by signal RECORD3. Third bit $P_3$ may be provided to coarse counter 46. Coarse counter 46 may generate a coarse counter signal (e.g., bits $C_1$, $C_2$, ..., $C_K$) based on bit $P_3$ and may provide the counter signal to first and second counter registers 66 and 68, which may be the same to counter register 50 in FIG. 3. While the signal triggering first register 66 is signal RECORD3, the signal triggering second register 68 may be a delayed version $PULSE_D$ of signal RECORD3. Delayed signal $PULSE_D$ may be generated by delay circuit 76 based on signal RECORD3. The delay between signal $PULSE_D$ and signal RECORD3 may be larger than the coarse counter delay. However, the delay may be short enough so as not to cause early coarse counting when a new counter value is updated by another edge of $P_3$. Register 66 may output bits $C_{11}$, ..., $C_{1K}$ when triggered by signal RECORD3 whereas register 68 outputs bits $C_{21}$, ..., $C_{2K}$ when triggered by signal $PULSE_D$. The number K may be the number of bits of the counter.

The outputs of registers 66 and 68 may be provided to multiplexer 72. Multiplexer 72 may be controlled by a bit of phase state signal $P'_3$. For example, multiplexer 72 may be controlled by a bit output by register 48 that corresponds to the phase bit of signal P provided to coarse counter 46 (e.g., multiplexer 72 may be controlled by bit $P'_3$ output by register 48). Multiplexer 72 may selectively route one of the output of register 66 and the output of register 68 to output logic 52 based on the value of bit $P'_3$. For example, multiplexer 72 may route $C_{21}$, ..., $C_{2K}$ to logic 52 when $P'_3$ is at a logic high level and may route $C_{11}$, ..., $C_H$ (to logic 52 when $P_3$ is at a logic low level. Using this technique, the coarse delay counting problem may be solved. However, it may raise a possible problem that, if the delay 76 is too large, even when $P'_3$ is at a logic high level, the output of coarse counter 46 stored in register 68 may be of the next $P_3$ pulse. This may cause an early coarse counting error as described above. In order to prevent such a problem, the delay may be less than six phase-delay states in order to ensure that, even if logic output signal RECORD3 is at the eighth phase state, signal $PULSE_D$ is not yet at the third phase state when the counter is triggered.

Figure 14A:
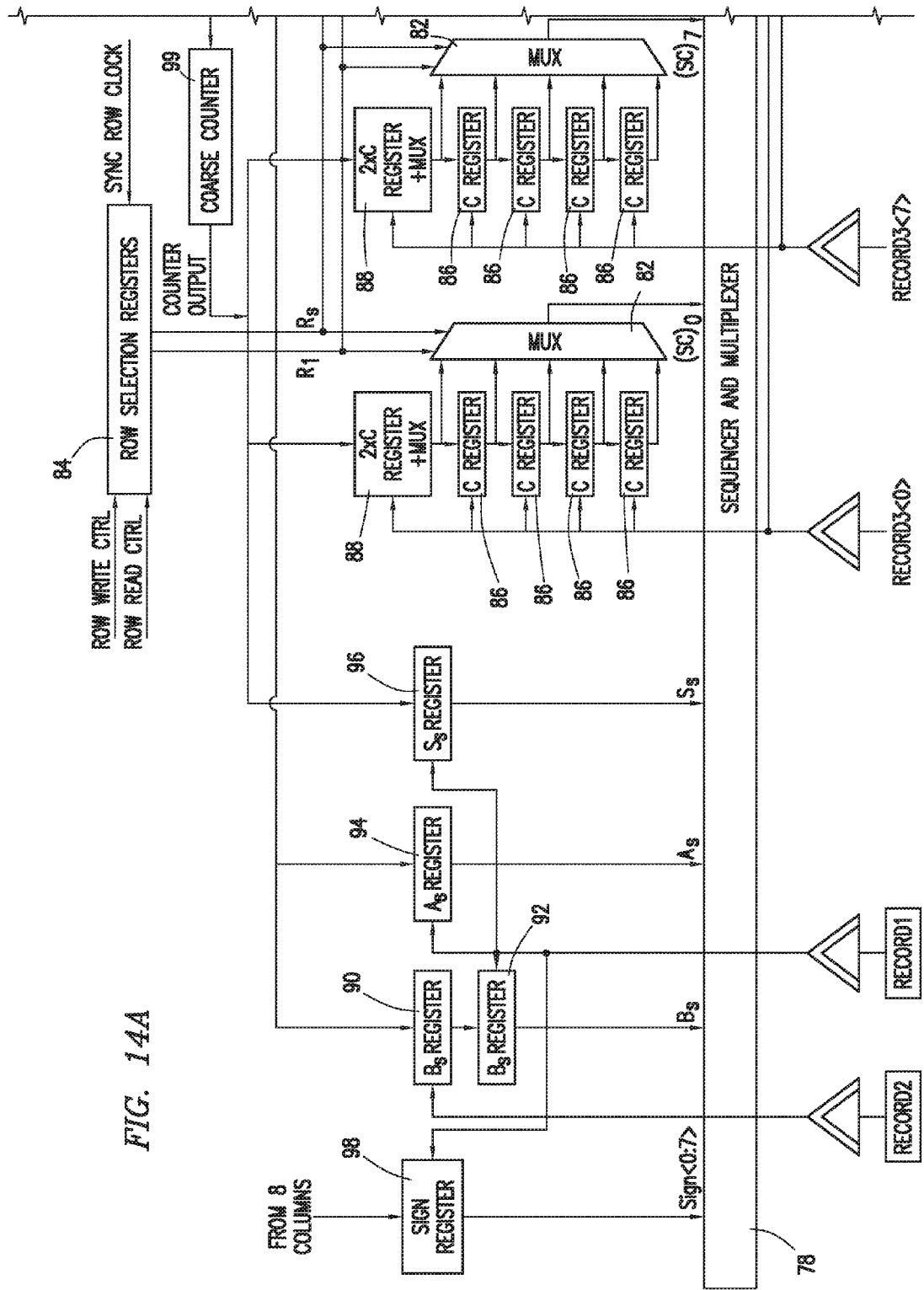
FIGS. 14A and 14B are a block diagram of illustrative analog-to-digital converter circuitry having multiple integrating channels in accordance with an embodiment.
Figure 14B:
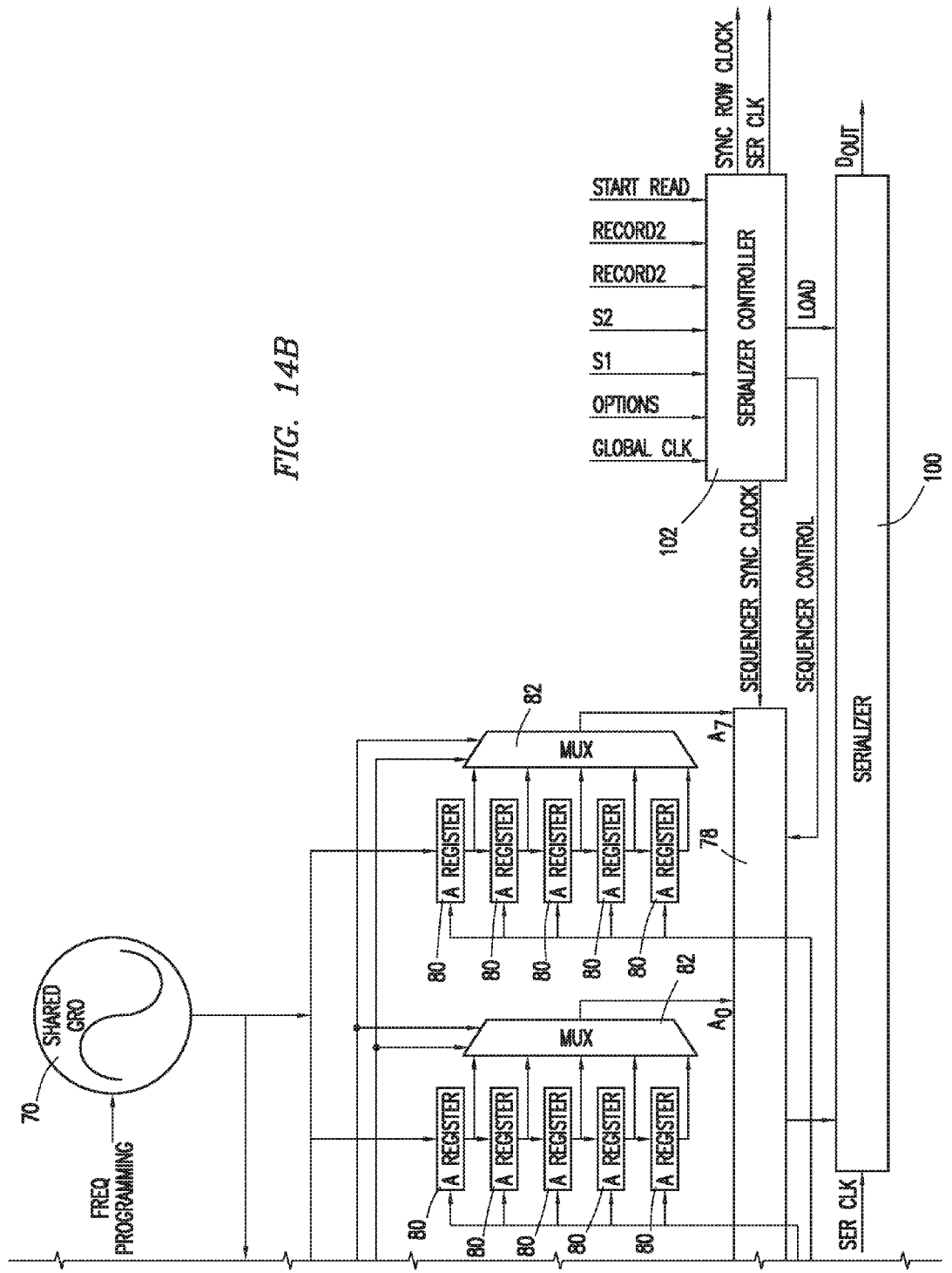

FIGS. 14A and 14B show a diagram of ADC 34 when GRO 70 is shared over eight integrating pixel channels (e.g., as shown in FIG. 6). The example of FIGS. 14A and 14B may be used to perform either a single-level voltage comparison or a multiple-level comparison. As described in connection with FIG. 8, there may be three signals RECORD1, RECORD2, and RECORD3. These signals may trigger corresponding registers (e.g. registers 92, 94, 96, and 98 for RECORD1, register 90 for RECORD2, and dedicated registers 80, 86, and 88 for RECORD3 from respective dedicated channels) to store the GRO phase state p and coarse counter output at the end of the second integration, the start of the second integration, and the moment when the integrator output crosses comparison voltages, respectively. While signals RECORD1 and RECORD2 are shared by eight integrating channels, there are eight pulses RECORD3<0-7> of the eight integrating channels.

As shown in FIGS. 14A and 14B, for each signal RECORD3<i>, there are five registers 80 (labeled "A Register"). Registers 80 may store the GRO phase states p for both the cases of single and multiple-level comparisons. Registers 80 may serve a similar function as registers 48 in FIG. 3. Multiplexers 82 may be controlled by the block Row Selection Register 84, which manages the readout sequence of registers 80, 86, and 88. There are four registers 86 (labeled "C Register") that store the counter outputs for both the cases of single-level and multiple-level comparison. Registers 66 and 68, delay 76, and multiplexer 72 as shown in FIG. 13 may be formed within block 88 if desired. A corresponding multiplexer 82 controlled by the block Row Selection Register 84 may manage the readout sequence of registers 86. Coarse counter 99, which may be the same to coarse counter 46 in FIG. 13, may be shared by all channels, and its outputs are buffered to counter registers.

Signal RECORD2 may triggers first registers 90 (labeled "$B_S$ Register") to store the GRO phases state information at the beginning of the second integration for all eight channels when the GRO is about to be enabled, which is shown in FIG. 8. For pipelined readout operation, the data may be readout while the analog portions of the ADC are still working. Signal RECORD1 may trigger register 92 to store the GRO phases state at the end of the second integration when shared GRO 70 is disabled. Signal RECORD1 may then trigger register 94 to store the GRO phases state after the GRO is disabled. RECORD1 may also triggers register 96 (labeled "$S_S$ Register") to store the counter output at that moment. RECORD1 may shift the phase state in register 90 to register 92 for pipelined readout operation such as RECORD2 may have no impact on the phase state information of the previous readout operation. Signal RECORD1 may trigger sign register 98 to store the signs of the input voltages of the eight integrating channels (e.g., positive or negative signs). Therefore, outputs $S_S$, $A_S$, and $B_S$ may represent the information of phase state before second integration when shared GRO 70 is not enabled, phase state and counter output value after second integration when shared GRO 70 is disabled, respectively.

Block Sequencer and multiplexer 78 may collect the outputs of multiplexer 82 and outputs from registers 94, 96, 92, and 98. The output of block 78 may be connected to serializer 100 to transmit serial data output DOUT. Both blocks 87 and 100 are synchronized and controlled by a serial controller 102. The design described in FIGS. 14A and 14B is an example of one possible configuration using the above-mentioned features. In general, any desired structure for ADC 34 may be used.

Figure 15:
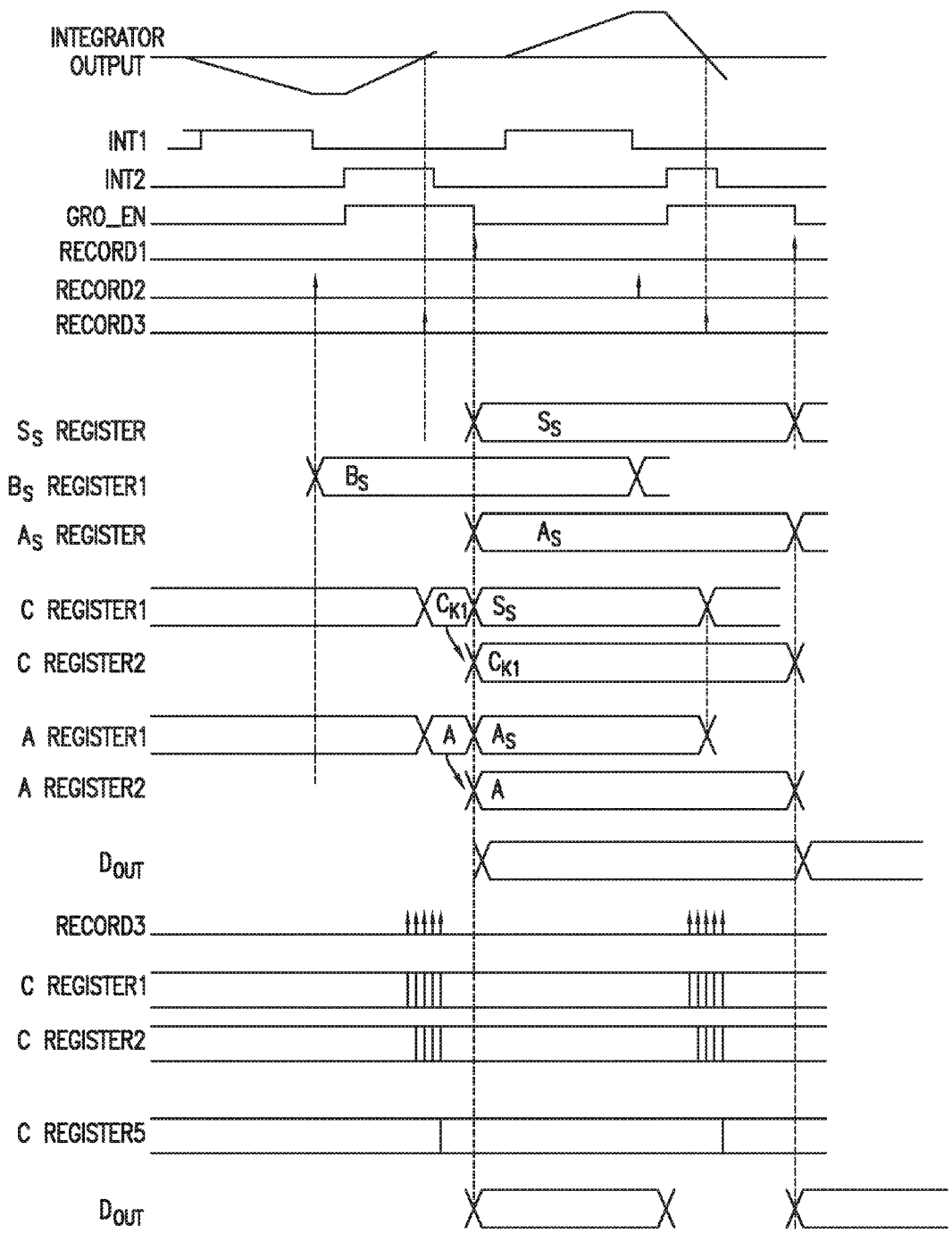
FIG. 15 is an illustrative timing diagram for operating analog-to-digital converter circuitry of the type shown in FIGS. 14A and 14B in accordance with an embodiment.

FIG. 15 is an example of a timing diagram for operating ADC 34 as shown in FIGS. 14A and 14B. As shown in FIG. 15, signals INT1 and INT2 may respectively correspond to switches S1 and one of S2 or S3 of FIG. 9 and during their respective "high" states may represent the first and second integrations performed by integrator 58, respectively. Signal GRO_EN may represent the GRO enable/disable timing, which may be the same for all columns. Signals RECORD1 and RECORD2 may be shared by eight pixel channels as shown in FIG. 6. Signal RECORD3 may trigger registers 80, 86, and 88 to output stored phase state data and coarse counter output to multiplexer 82 and subsequently to sequencer and multiplexer 78. Signal RECORD1 may trigger registers 94 and 96. Signal RECORD2 may trigger register 90, whereas signal RECORD1 may trigger register 92 (e.g., "$B_S$ Register 2"), which is not shown for simplicity. Registers 66 and 68 (e.g., "C Register 1 and 2") in FIG. 15 may correspond to the block '2×C Registers+Mux' 88 in FIGS. 14A and 14B and C register 86 right next to block 88 in order to achieve a pipelined readout operation. In the case of single-level comparison, only one rising edge of RECORD3 may be generated. However, in order to readout the data pipelining with the analog signal processing, the stored values in the registers may be moved to the next registers for read out, leaving the previous registers available for a new triggering. In the case of single-level comparison, the moving action may be triggered by signal RECORD1 and then DOUT readout can overlap with the next analog integration and digital triggering.

In multiple-level comparison, if a pipelined readout scheme is needed, it may require five additional registers to buffer values of the five registers. However, multi-level comparison may be applied only for high resolution conversion, for which the speed is not as important. Therefore, DOUT may be ready to be sent out immediately after the RECORD1 is pulsed and until the start of the next second integration period. Because after the start of the next integration period, the RECORD3 may trigger the storage of new unwanted phase signals and corrupt DOUT.

The example above, in which ADC 34 is formed using a dual-slope architecture, is merely illustrative. If desired, ADC 34 may include single-slope ADC circuitry for performing single-slope analog-to-digital conversion. During the single integration period of a single-slope ADC operation, a GRO may use multiple delay stages for phase-delay-counting to increase the conversion speed, similar to the process done for the second integration period of a dual-slope ADC operation. The single-slope ADC circuitry may also include registers (e.g., a phase state register, a counter register) with similar functionalities as those of the dual-slope ADC circuitry, for example. The GRO for the single-slope ADC may also be shared between multiple pixel channels mentioned previously for dual-slope operation if desired.

Figure 16:
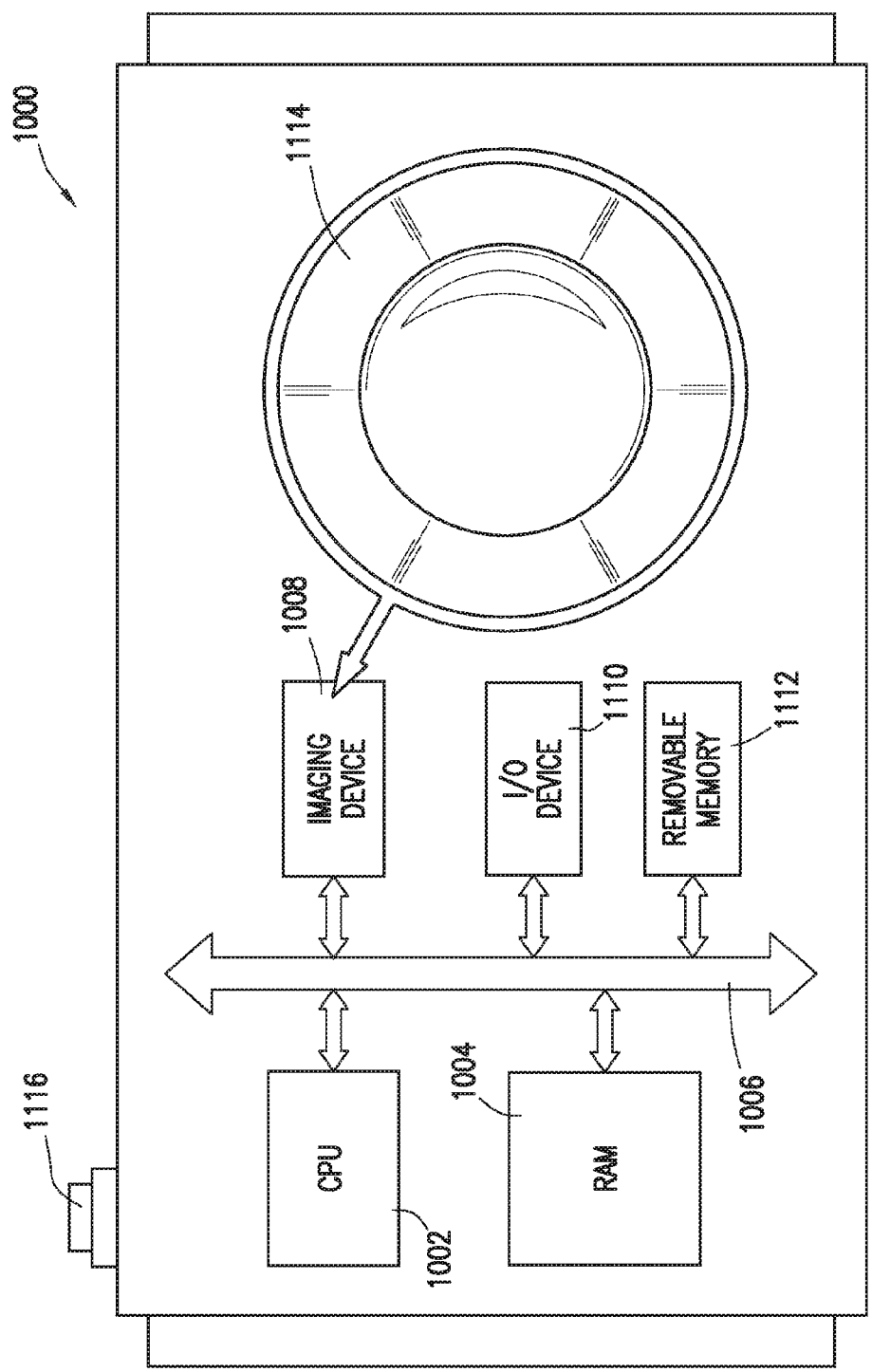
FIG. 16 is a block diagram of a processor system that may employ some of the embodiments of FIGS. 1-15 in accordance with an embodiment of the present invention.

FIG. 16 is a simplified diagram of an illustrative processor system 1000, such as a digital camera, which includes an imaging device 1008 (e.g., the camera module of FIG. 1) employing an imager having ADC circuitry as described above in connection with FIGS. 1-15. Without being limiting, such a system could include a computer system, still or video camera system, scanner, machine vision system, vehicle navigation system, video phone, surveillance system, auto focus system, star tracker system, motion detection system, image stabilization system, and other systems employing an imaging device.

Processor system 1000, for example a digital still or video camera system, generally includes a lens 1114 for focusing an image onto one or more pixel array in imaging device 1008 when a shutter release button 1116 is pressed and a central processing unit (CPU) 1002 such as a microprocessor which controls camera and one or more image flow functions. Processing unit 1102 can communicate with one or more input-output (I/O) devices 1110 over a system bus 1006. Imaging device 1008 may also communicate with CPU 1002 over bus 1006. System 1000 may also include random access memory (RAM) 1004 and can optionally include removable memory 1112, such as flash memory, which can also communicate with CPU 1002 over the bus 1006. Imaging device 1008 may be combined with the CPU, with or without memory storage on a single integrated circuit or on a different chip. Although bus 1006 is illustrated as a single bus, it may be one or more busses, bridges or other communication paths used to interconnect system components of system 1000.

Various embodiments have been described illustrating systems and methods for converting analog image signals to digital image signals using an analog-to-digital converter having a gated ring oscillator for phase delay counting. ADCs that perform phase delay counting may perform faster conversions than analog-to-digital converters that use rising/falling edge clock counting. The dual-slope architecture may relax the counting frequency variation requirement because the converted data are derived from the ratio of the second and the first integrations, during which the same frequency (e.g., phase delay) is used for counting.

The analog-to-digital converter may include an integrator, a comparator, logic circuitry, a gated ring oscillator, a coarse counter, a phase state register, and a counter register. The analog input signal may be received at one of the inputs of the integrator. The integrator may integrate the analog input signal to generate an integrator output. The integrator output may be received at an input of the comparator. The comparator may compare the integrator output to a comparison voltage to generate a comparator output. The comparator output may be processed to generate a control signal. The control signal may control the output of stored phase states in the phase state register to the logic circuitry for generating the digital outputs.

The gated ring oscillator may send a phase state signal continuously to the phase state register. The phase state signal may include a number of phase nodes, which are created by transmitting a signal through a number of delay stages. The phase state register may store the most current phase state, for example. The coarse counter may continuously receive one of the phase nodes of the phase state signal from the gated ring oscillator and may output a corresponding counter signal to the counter register. The counter register may store the most current counter signal received from the coarse counter, for example. The control signal may control the counter register to output the stored counter value to the logic circuitry. The logic circuitry may generate a digital version of the analog input signal based on the output of the phase state register and the counter register.

In one suitable arrangement, the analog-to-digital circuitry may perform analog-to-digital conversion on analog pixel values generated by an array of image sensor pixels. If desired, multiple pixel columns or channels in the array may share a single gated ring oscillator. Additional control signals may be generated to trigger the appropriate registers during a start and an end of an integration period. The aforementioned control signal may be modified to continuously run between the start and the end of the integration period to ensure all of the relevant registers for all channels are triggered.

In accordance with any of the above arrangements, the analog-to-digital converter may be a single-slope or dual slope analog-to-digital converter that uses the gated ring oscillator to generate phase state signals and coarse counter outputs for counting conversion timing.

The foregoing is merely illustrative of the principles of this invention and various modifications can be made by those skilled in the art without departing from the scope and spirit of the invention. The foregoing embodiments may be implemented individually or in any combination.

What is claimed is:

1. An analog-to-digital converter that receives an analog signal, comprising:
   a plurality of delay stages that output a phase state signal;
   a phase state register that stores the phase state signal;
   a coarse counter that generates a counter signal based on a portion of the phase state signal;
   circuitry that generates a digital signal corresponding to the received analog signal based on the counter signal and the phase state signal; and
   a counter register that stores the counter signal and that is coupled in parallel with the phase state register between the plurality of delay stages and the circuitry.

2. The analog-to-digital converter defined in claim 1, wherein the counter register is configured to provide the counter signal to the circuitry based on a control signal.

3. The analog-to-digital converter defined in claim 2, further comprising:
   an integrator that receives the analog signal at an integrator input and that outputs an integrator output; and
   a comparator that receives the integrator output at a comparator input and that outputs a comparator output based on the integrator output.

4. The analog-to-digital converter defined in claim 3, wherein the integrator input is switchably coupled to positive and negative reference voltages.

5. The analog-to-digital converter defined in claim 3, wherein the comparator input is switchably coupled to a plurality of comparison voltages and wherein the comparator is configured to generate the control signal by comparing the integrator output to a selected one of the plurality of comparison voltages.

6. The analog-to-digital converter defined in claim 5, further comprising:
   digital control circuitry that controls which one of the plurality of comparison voltages is coupled to the comparator input.

7. Analog-to-digital converter circuitry, comprising:
   an integrator that receives an analog signal;
   a gated ring oscillator that outputs a phase state signal that identifies a phase delay state, wherein the gated ring oscillator comprises a plurality of inverter circuits coupled in series and wherein an output of the plurality of inverter circuits is coupled to an input of the plurality of inverter circuits; and
   circuitry that receives the phase state signal and that generates a digital signal corresponding to the analog signal received by the integrator based on the phase delay state identified by the phase state signal.

8. The analog-to-digital converter circuitry defined in claim 7, wherein the circuitry comprises a phase state register that receives the phase state signal from the gated ring oscillator.

9. The analog-to-digital converter circuitry defined in claim 8, wherein the circuitry further comprises a counter that receives a portion of the phase state signal from the gated ring oscillator.

10. The analog-to-digital converter circuitry defined in claim 9, wherein the counter outputs a counter value, and wherein the circuitry further comprises:
    a counter register that receives the counter value from the counter.

11. The analog-to-digital converter circuitry defined in claim 10, wherein the circuitry further comprises:
    output logic circuitry coupled to an output of the phase state register and an output of the counter register, wherein the output logic circuitry outputs the digital signal.

12. The analog-to-digital converter circuitry defined in claim 11, further comprising:
    an additional counter register that receives the counter value; and
    a multiplexer having a first input coupled to an output of the counter register, having a second input coupled to an output of the additional counter register, and having an output coupled to the output logic circuitry.

13. The analog-to-digital converter circuitry defined in claim 12, further comprising:
   a logic circuit that generates a phase state recordation control signal, wherein the counter register and the phase state register receive the phase state recordation control signal from the logic circuit; and
   a delay circuit that receives the phase state recordation control signal from the logic circuit and that generates a delayed signal based on the phase state recordation control signal, wherein the additional counter register receives the delayed signal from the delay circuit.

14. The analog-to-digital converter circuitry defined in claim 7, wherein the phase state signal comprises a set of phase nodes and wherein the portion of the phase state signal received by the counter comprises a selected one of the set of phase nodes.

15. The analog-to-digital converter circuitry defined in claim 7, further comprising:
   a comparator coupled to an output of the integrator that generates a comparator output signal; and
   logic circuitry coupled to an output of the comparator, wherein the logic circuitry generates a phase state recordation control signal based on the comparator output signal and provides the phase state recordation control signal to the circuitry that receives the phase state signal from the gated ring oscillator.

16. The analog-to-digital converter circuitry defined in claim 15, wherein a first input of the comparator is coupled to the output of the integrator and wherein a second input of the comparator is switchably coupled to a plurality of comparison voltage sources.

17. The analog-to-digital converter circuitry defined in claim 7, wherein the integrator is configured to receive a selected one of the analog signal, a positive reference voltage, and a negative reference voltage.

18. A system, comprising:
   a central processing unit;
   memory;
   a lens;
   input-output circuitry;
   an array of image sensor pixels, wherein the lens focuses image light onto the array of image sensor pixels and wherein the image sensor pixels are configured to generate analog image signals in response to the image light; and
   analog-to-digital converter circuitry that is configured to convert the analog image signals into digital pixel data, wherein the analog-to-digital converter circuitry comprises:
      a plurality of delay stages that output a phase state signal that is used to convert the analog image signals into digital pixel data;
      a phase state register that receives the phase state signal outputted from the plurality of delay stages; and
      a counter register that receives a count value generated based on the phase state signal and that is coupled in parallel with the phase state register.

19. The system defined in claim 18, further comprising:
   a plurality of data lines coupled between the plurality of delay stages and the phase state register, wherein the phase state signal comprises a plurality of phase nodes, and wherein each of the plurality of phase nodes are provided to the phase state register over different respective data lines of the plurality of data lines.

\* \* \* \* \*